US009537291B1

(12) United States Patent
Wilding et al.

(10) Patent No.: US 9,537,291 B1
(45) Date of Patent: Jan. 3, 2017

(54) ELEVATED AUTOMATIC TRANSFER SWITCH CABINET

(71) Applicant: Amazon Technologies, Inc., Seattle, WA (US)

(72) Inventors: Robert David Wilding, Seattle, WA (US); Peter George Ross, Olympia, WA (US); Faran Harold Kaplan, Seattle, WA (US); John William Eichelberg, Spokane, WA (US)

(73) Assignee: Amazon Technologies, Inc., Reno, NV (US)

( * ) Notice: Subject to any disclaimer, the term of this patent is extended or adjusted under 35 U.S.C. 154(b) by 18 days.

(21) Appl. No.: 14/733,837

(22) Filed: Jun. 8, 2015

(51) Int. Cl.
*H05K 7/20* (2006.01)
*H02B 1/36* (2006.01)
(Continued)

(52) U.S. Cl.
CPC ........ *H02B 1/36* (2013.01); *G06F 1/26* (2013.01); *H02B 1/306* (2013.01);
(Continued)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
(Continued)

(56) References Cited

U.S. PATENT DOCUMENTS

| 5,345,779 A * | 9/1994 | Feeney | E04F 15/02411 361/695 |
| 2009/0109622 A1* | 4/2009 | Parish | H05K 7/20772 361/699 |

(Continued)

OTHER PUBLICATIONS

"Using Static Transfer Switches to Enhance Data Center Availability and Maintainability", Emerson Network Power, 2010, pp. 1-16.
(Continued)

*Primary Examiner* — Anthony Haughton
*Assistant Examiner* — Razmeen Gafur
(74) *Attorney, Agent, or Firm* — Robert C. Kowert; Meyertons, Hood, Kivlin, Kowert & Goetzel, P.C.

(57) ABSTRACT

An elevated automatic transfer switch (ATS) cabinet provides modular and incremental power support redundancy to a set of electrical loads which reduces capital waste and increases the floor space which can be occupied by electrical loads. The cabinet includes a mounting element which can be coupled to a free-standing structure proximate to the floor space, so that the cabinet is supported by the structure in an elevated position and is freed from occupying floor space. The cabinet includes slots in which separate ATS modules can be installed via blind mate connections, thereby enabling modular and incremental installation of ATS support capacity in the cabinet based on incremental installation of electrical loads. The cabinet can physically couple with power cables extending from separate electrical loads, so that the cabinet electrically couples ATS modules to electrical loads independently of branch circuits between the cabinet and the electrical loads.

20 Claims, 7 Drawing Sheets

(51) Int. Cl.
*G06F 1/26* (2006.01)
*H02B 1/30* (2006.01)
*H01L 23/473* (2006.01)

(52) U.S. Cl.
CPC ..... *H05K 7/20145* (2013.01); *H05K 7/20736* (2013.01); *H05K 7/20745* (2013.01)

(58) Field of Classification Search
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 2009/0168345 A1* | 7/2009 | Martini | F24F 11/0001 361/691 |
| 2009/0195977 A1* | 8/2009 | Fink | H05K 7/20 361/679.46 |
| 2009/0296352 A1* | 12/2009 | Lima | H05K 1/0207 361/711 |
| 2010/0027216 A1* | 2/2010 | Matsushima | H05K 7/20745 361/679.49 |
| 2010/0043858 A1* | 2/2010 | Matsui | H05K 7/20772 136/205 |
| 2011/0242755 A1* | 10/2011 | Zeighami | F24F 11/0001 361/679.46 |
| 2011/0317357 A1* | 12/2011 | Sato | H05K 7/20754 361/679.48 |
| 2011/0317367 A1* | 12/2011 | Campbell | H05K 7/20809 361/700 |
| 2012/0014060 A1* | 1/2012 | Slessman | H05K 7/20736 361/691 |
| 2012/0033377 A1* | 2/2012 | Salpeter | H05K 7/1488 361/679.53 |
| 2012/0075806 A1* | 3/2012 | Wormsbecher | H05K 7/1497 361/701 |
| 2012/0127653 A1* | 5/2012 | Keisling | H05K 7/20827 361/679.46 |
| 2012/0147560 A1* | 6/2012 | Zeng | H05K 7/20545 361/690 |
| 2012/0201003 A1* | 8/2012 | Shimasaki | H05K 7/20736 361/695 |
| 2012/0300391 A1* | 11/2012 | Keisling | H05K 7/20745 361/679.46 |
| 2013/0003299 A1* | 1/2013 | Wissner | H02M 7/003 361/695 |
| 2013/0017955 A1* | 1/2013 | Hennessy | H05K 7/20709 505/170 |
| 2013/0063897 A1* | 3/2013 | Howes | H05K 7/20936 361/700 |
| 2013/0107448 A1* | 5/2013 | Hamburgen | H05K 7/2079 361/679.47 |
| 2013/0128455 A1* | 5/2013 | Koblenz | G05D 23/1917 361/692 |
| 2013/0135819 A1* | 5/2013 | Wang | H04L 41/00 361/679.48 |
| 2013/0176678 A1* | 7/2013 | Campbell | G06F 1/20 361/679.46 |
| 2013/0201618 A1* | 8/2013 | Czamara | H05K 7/1497 361/679.5 |
| 2013/0235524 A1* | 9/2013 | Baba | H05K 7/1452 361/695 |
| 2013/0258582 A1* | 10/2013 | Shelnutt | G06F 1/206 361/679.48 |
| 2013/0265725 A1* | 10/2013 | Harvilchuck | G06F 1/181 361/720 |
| 2013/0286587 A1* | 10/2013 | Martini | F24F 11/0001 361/695 |
| 2013/0301219 A1* | 11/2013 | Knudsen | H05K 7/20154 361/697 |

OTHER PUBLICATIONS

"Specification PPC-ATS 1101-913 & 1101-917 100AMP & 200AMP 24 Position", Transtector Systems, Inc., Jan. 16, 2008, pp. 1-20.

* cited by examiner

ELEVATED AUTOMATIC TRANSFER SWITCH CABINET

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Because the computer room of a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 208V). A network of cabling, bus bars, power connectors, and power distribution units, is used to deliver the power at the lower voltage to numerous specific components in the facility.

Some data centers have no redundancy at the PDU level. Such data centers may have a large affected zone when a UPS or PDU failure in the power system occurs. In addition, some data centers have "single threaded" distribution via the electrical supply to the floor, and in which maintenance can only be performed when the components are shut-off. The down-time associated with maintenance and reconfiguration of primary power systems in a data center may result in a significant loss in computing resources. In some critical systems such as hospital equipment and security systems, down-time may result in significant disruption and, in some cases, adversely affect health and safety.

Some systems include dual power systems that provide redundant power support for computing equipment. In some systems, an automatic transfer switch ("ATS") provides switching from a primary power system to a secondary (e.g., back-up) power system. In a typical system, the automatic transfer switch automatically switches a server rack to the secondary system upon detecting a fault in the primary power. To maintain the computing equipment in continuous operation, the automatic transfer switch may need to make the transfer to secondary power system rapidly (for example, within about 16 milliseconds).

Some data centers include back-up components and systems to provide back-up power to servers in the event of a failure of components or systems in a primary power system. In some data centers, a primary power system may have its own back-up system that is fully redundant at all levels of the power system. Such a level of redundancy for the systems and components supported by the primary and fully-redundant back-up system may be referred to as "2N" redundancy. For example, in a data center having multiple server rooms, one or more server racks may receive power support from a primary power system and fully-redundant back-up power system. The back-up system for each server room may have a switchboard, uninterruptible power supply (UPS), and floor power distribution unit (PDU) that mirrors a corresponding switchboard, uninterruptible power supply, and floor power distribution unit in the primary power system for that server room. Providing full redundancy of the primary power systems may, however, be very costly both in terms of capital costs (in that in may require a large number of expensive switchboard, UPSs, and PDUs, for example) and in terms of costs of operation and maintenance. In addition, with respect to the primary computer systems, special procedures may be required to switch components from the primary system to a back-up system to ensure uninterrupted power supply for the servers, further increasing maintenance costs. As a result, some data centers may include a back-up system that is less than fully redundant for a primary power system. Such a level of redundancy for the systems and components supported by the primary and fully-redundant back-up system may be referred to as "N+1" redundancy. While N+1 redundancy may not provide fully-redundant reserve power support for computing equipment, such redundancy may involve lower capital and operating costs.

Some systems include one or more power systems that provide power concurrently to a set of computing equipment independently of a switching between the power servers upstream of the set of computing equipment. Such systems may provide 1N redundancy, 2N redundancy, etc. for the computing units.

In some data centers, some sets of computing equipment may be configured for power support of various types of redundancy. For example, some server racks having servers configured for critical tasks may receive 2N reserve power support, some server racks may receive N+1 reserve power support, and some server racks may receive a concurrent supply of power from one or more separate power feeds independently of an upstream transfer switch. Configuring each rack for a particular type of power redundancy with support from particular power systems may be costly and time-consuming, as each configuration may require specific configurations of specific upstream systems and components to establish a given power support redundancy for a given server rack.

As a result, providing various redundancies, from various power sources, to various sets of computing equipment in a data center may require excessive expenditures of time, resources, and data center floor space, wall space, etc. to provide specific systems and components for each particular power support redundancy type from each particular power system used to provide such redundancies. In addition, due to the specific systems and components, and configurations thereof, required to implement a given redundancy, changing a power support redundancy for a particular set of computing equipment may be time consuming and expensive, as such changes may require re-arrangement, addition, removal, etc. of various systems and component configurations specific to enabling such redundancies. Such changes may further require extended computing unit downtime to implement changes in specific systems and components, as such reconfigurations of various systems and components in a data center may require temporarily taking otherwise unrelated systems and components offline, thereby exacerbating costs.

The amount of computing capacity needed for any given data center may change rapidly as business needs dictate. Most often, there is a need for increased computing capacity at a location. Initially providing computing capacity in a data center, or expanding the existing capacity of a data center (in the form of additional servers, for example), is resource-intensive and may take many months to implement. Substantial time and resources are typically required to design and build a data center (or expansion thereof), lay cables, install racks, enclosures, and cooling systems to implement waste heat removal therefrom. Additional time and resources are typically needed to conduct inspections and obtain certifications and approvals, such as for electrical and HVAC systems.

Figure 1:
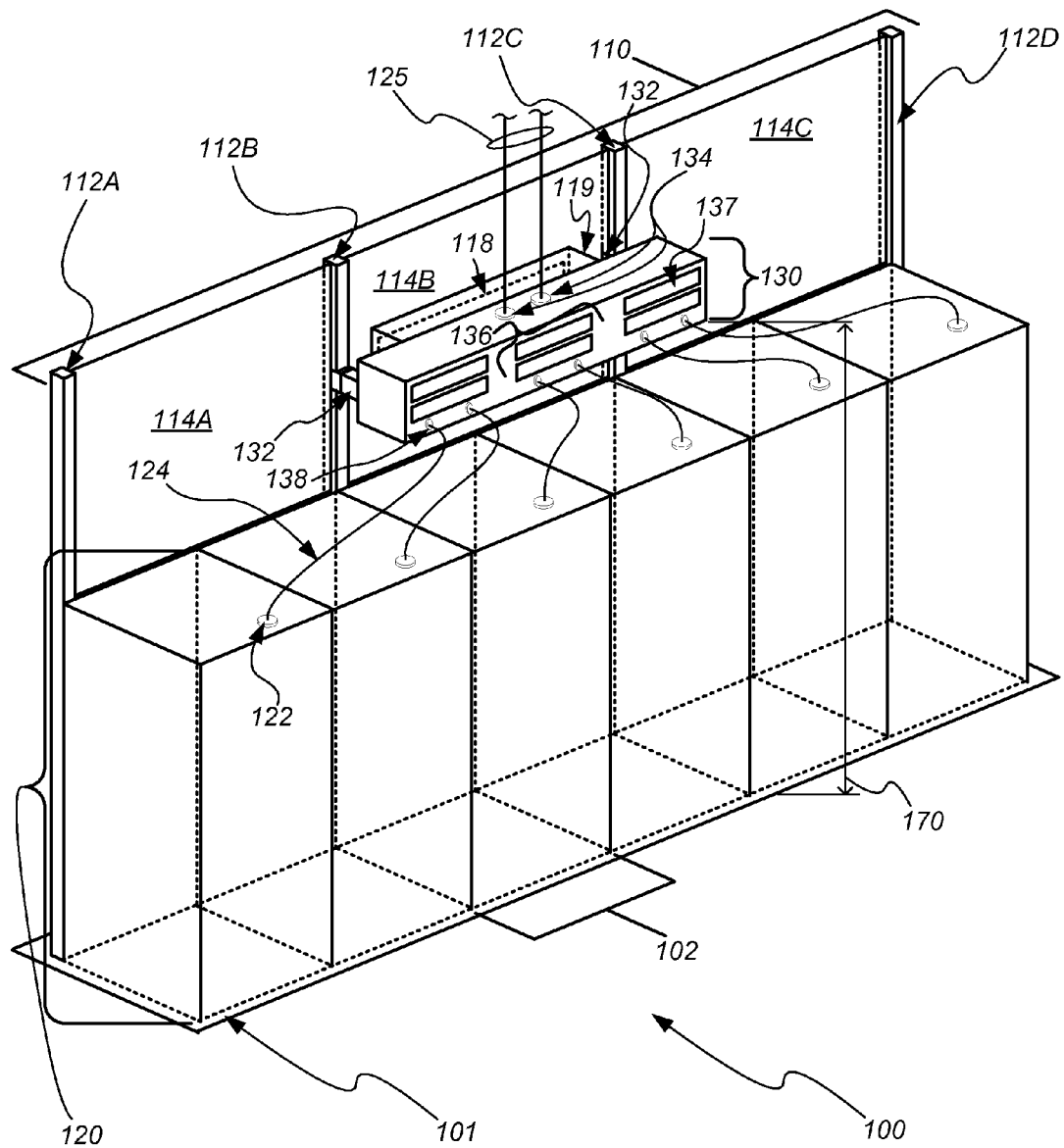
FIG. 1 is a schematic illustrating a perspective view of an electrical load space in which a row of electrical loads and a free-standing structure are installed and an elevated automatic transfer switch (ATS) cabinet which is supported in an elevated position over the electrical loads by the free-standing structure and provides power redundancy support to each of the electrical loads, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of elevated automatic transfer switch (ATS) cabinets are disclosed.

According to one embodiment, a data center includes at least two power distribution systems configured to supply separate power feeds and a computer space configured to support computing operations by two parallel rows of racks. The computer space includes an aisle space, at least two free-standing exhaust plenum structures, and at least two elevated automatic transfer switch (ATS) cabinets. The aisle space includes a long axis and at least two separate rows of rack computer systems. Each row of rack computer systems is positioned on an opposite side of the long axis, and each rack computer system is configured to receive intake air on a front side facing the long axis and to discharge exhaust air on a rear side that faces away from the long axis. Each free-standing exhaust plenum structure is mounted adjacent to rear sides of separate rows of rack computer systems on opposite sides of the cold aisle space. Each free-standing exhaust plenum structure comprises a frame structure that is configured to provide structural support to an enclosure of an internal exhaust air plenum which is configured to receive the exhaust air from the rear side of an adjacent row of rack computer systems. Each elevated ATS cabinet is mounted in an elevated position above a separate row of rack computer systems and is configured to selectively provide electrical power support to the separate rows of rack computer systems from a selected power feed of the separate power feeds. Each elevated ATS cabinet includes a mounting element configured to couple the elevated ATS cabinet with a frame structure of a separate free-standing exhaust plenum structure, at least two power bus systems configured to carry electrical power from a separate power feed of the separate power feeds, a set of ATS modules installed in separate ATS module slots, and a set of power outlet receptacles which are each configured to electrically couple a power outlet of a separate ATS module with an electrical power cable extending from a separate rack computer system, independently of any branch circuits. Each ATS module comprises an ATS configured to selectively distribute electrical power from a separate power feed to an outlet. The ATS modules and the ATS module slots comprise blind mate connections configured to electrically couple ATS modules installed in ATS module slots with the separate power bus systems via blind mate connections.

According to one embodiment, an apparatus includes an elevated automatic transfer switch (ATS) cabinet configured to provide electrical power support to a set of electrical loads via a set of ATS modules each configured to selectively distribute electrical power to separate electrical loads from one of a set of electrical power feeds. The elevated ATS cabinet includes a mounting arm element configured to physically couple with a free-standing structural frame, such that the elevated ATS cabinet is structurally supported by the free-standing structural frame in a suspended elevated position over a floor element. The elevated ATS cabinet further includes a set of ATS module slots, each comprising a set of blind-mate connectors which are electrically coupled to separate electrical power feeds, wherein each ATS module slot is configured to electrically couple a separate ATS module mounted in the respective ATS module slot with each of the separate electrical power feeds based on blind-mate connections between the set of blind-mate electrical connectors and corresponding connectors of the separate ATS module.

According to one embodiment, a method includes configuring an elevated automatic transfer switch (ATS) cabinet to provide electrical power support to a set of electrical loads via a set of ATS modules which are each configured to selectively distribute electrical power to separate electrical loads from one of a set of electrical power feeds. The configuring includes physically coupling a mounting arm element of the elevated ATS cabinet with a free-standing structural frame, such that the elevated ATS cabinet is structurally supported by the free-standing structural frame in a suspended elevated position over a floor element. The configuring further includes installing the set of ATS modules in a set of ATS module slots of the elevated cabinet, such that the installing comprises establishing blind-mate connections between the set of blind-mate electrical connectors and corresponding connectors of the separate ATS modules which electrically couples the separate ATS modules with the separate electrical power feeds. Each ATS module slot comprises a set of blind-mate connectors which are electrically coupled to separate electrical power feeds As used herein, "data center" includes any facility or portion of a facility in which computer operations are carried out. A data center may include servers dedicated to specific functions or serving multiple functions. Examples of computer operations include information processing, communications, simulations, and operational control.

As used herein, "operating power" means power that can be used by one or more computer system components. Operating power may be stepped down in a power distribution unit or in elements downstream from the power distribution units. For example, a server power supply may step down operating power voltages (and rectify alternating current to direct current).

As used herein, providing power "support" refers to providing one or more power feeds to be available to one or more downstream systems and components, including one or more electrical loads. Such provided power feeds may be precluded from being received by the systems and components but may be made available for receipt based at least in part upon a positioning of one or more components upstream of the systems and components. For example, a reserve power system may provide reserve power support to an electrical load by providing a reserve power feed that can be selectively routed to the load by a transfer switch that is downstream of the reserve power system and upstream of the load, where the transfer switch may selectively route the reserve power feed or a primary power feed to the load based at least in part upon one or more conditions associated with the primary power feed.

As used herein, "power distribution unit", also referred to herein as a "PDU", means any device, module, component, or combination thereof, which can be used to distribute electrical power. The elements of a power distribution unit may be embodied within a single component or assembly (such as a transformer and a rack power distribution unit housed in a common enclosure), or may be distributed among two or more components or assemblies (such as a transformer and a rack power distribution unit each housed in separate enclosure, and associated cables, etc.).

As used herein, "primary power" means any power that can be supplied to an electrical load, for example, during normal operating conditions.

As used herein, "floor power distribution unit" refers to a power distribution unit that can distribute electrical power to various components in a computer room. In certain embodiments, a power distribution unit includes a k-rated transformer. A power distribution unit may be housed in an enclosure, such as a cabinet.

As used herein, "rack power distribution unit" refers to a power distribution unit that can be used to distribute electrical power to various components in a rack. A rack power distribution may include various components and elements, including wiring, bus bars, connectors, and circuit breakers.

As used herein, "reserve power" means power that can be supplied to an electrical load upon the failure of, or as a substitute for, primary power to the load.

As used herein, "physically coupled" refers to a connection that physically connects two or more components and is configured to electrically couple and electrically isolate the two or more components. For example, two wires are physically coupled via a switch. And, the switch is configured to electrically couple and electrically isolate the two wires by closing and opening the switch.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

FIG. 1 is a schematic illustrating a perspective view of an electrical load space in which a row of electrical loads and a free-standing structure are installed and an elevated automatic transfer switch (ATS) cabinet which is supported in an elevated position over the electrical loads by the free-standing structure and provides power redundancy support to each of the electrical loads, according to some embodiments. The electrical load space 100 can be included in any of the embodiments of electrical load spaces herein.

Electrical load space 100, also referred to as a load space, can be included in one or more various facilities, including a data center, where the load space is referred to as a computer space and the electrical loads installed therein include rack computer systems.

Load space 100 includes a floor element 101. Load space 100 includes a set of load positions 102 on the floor element 101. The individual load positions define positions, on floor element 101, on which separate electrical loads can be installed. A free-standing structure 110, which can include a free-standing exhaust plenum structure, is installed on the floor element 101 and includes a set of frame members 112A-D to which wall elements 114A-C, also referred to as enclosure elements, are coupled. The illustrated free-standing structure 110 can partition the load space 100 into two regions, where one region includes the load positions 102 and another region, on the opposite side of the structure 110 from the load positions, is at least partially partitioned from the one region.

As shown, a set of electrical loads 120, each of which includes a power interface 122, are each installed on separate load positions 102 on the floor element 101. The loads 120 and wall elements 114A-C collectively partition the load space 100 into separate regions. In some embodiments, the structure 110 and electrical loads 120 are installed in a configuration which enables exhaust air discharged from the electrical loads 120, which removes heat generated by one or more heat generating components within the electrical loads 120, to be directed to the region of the load space 100 which is located on the opposite side of the structure 110 from the electrical loads 120, so that the exhaust air is partitioned from interacting with intake air located on the common side of the structure 110 as the electrical loads 120.

An elevated Automatic Transfer Switch (ATS) cabinet 130 is installed at an elevated position over the set of electrical loads 120. The elevated ATS cabinet includes multiple sets 136 of ATS modules 137 which provide power support to separate electrical loads 120. Each ATS module 137 in cabinet 130 is electrically coupled to a separate electrical load 120 and provides power support to the separate electrical load 120. As referred to herein, providing "power support" to an electrical load can include one or more of electrical power support, where electrical power is distributed to the electrical load to support operation of the electrical load, power redundancy support, where electrical power is selectively provided to the electrical load from one of a selection of power feeds to provide power support redundancy to the electrical load, some combination thereof, etc.

As shown, cabinet 130 includes a set of cabinet inlet receptacles 134 which are each configured to be coupled to separate power feed lines 125, where each separate power feed line 125 carries a separate power feed. In some embodiments, the separate power feeds are supplied from separate power sources, which can include separate power distribution systems. In some embodiments, multiple power feeds received at multiple receptacles 134 are supplied by a common power source. In some embodiments, a power feed line 125 carries a multiple-phase power feed, and separate sets 136 of ATS modules 137 distribute a separate phases of the power feed to separate electrical loads 120.

Each ATS 137 is configured to selectively distribute electrical power from one of the separate power feeds received at the receptacles 134 from the lines 125 to a separate and particular cabinet outlet receptacle 138. As shown, cabinet 130 includes separate receptacles 138 which are each separately coupled within cabinet 130 to separate ATS modules 137, and separate electrical loads 120 are electrically coupled to separate receptacles 138 of the cabinet 130 via separate instances of power conduits 124. As a result, each electrical load 120 is electrically coupled to a separate ATS module 137 included in the cabinet, via a separate power conduit 124 and receptacle 138, and each separate ATS module 137 provides power support to a separate electrical load 120. Furthermore, cabinet 130 can be referred to as providing power support to all of the electrical loads 120.

As shown, the elevated ATS cabinet 130 includes mounting arm elements 132 which extend from a rear end of the cabinet 130 and which are coupled to frame members 112B-C of the free-standing structure 110. In some embodiments, the structure 110 wall elements 114 can include gaps through which the mounting arm elements 132 can extend to couple with frame members 112 on opposite sides of the wall elements 114 from the cabinet 130. The cabinet is installed on a common side of the structure 110 as the electrical loads, as the cabinet receptacles 138 are coupled to the loads 120. As a result, where cooling intake air is circulated in the region of the load space 100 in which the electrical loads 120 are installed, the cabinet 130 can utilize the cooling air to remove heat generated by heat generating components in the cabinet 130.

As a result of coupling the mounting arm elements 132 of the cabinet 130 to the frame members 112B-C, the structure 110 supports the structural load of the cabinet 130 at a particular elevated position which is located at a particular height 170 over the floor element 101, based on the elevated position over floor element 101 at which the mounting arm elements 132 are coupled to the frame members 112B-C. As shown, the cabinet 130 is supported by the structure, via the frame members 112B-C and the mounting arm elements 132, at an elevated position over the floor element 101 and the electrical loads 120 installed on the load positions 102 on the floor element 101.

Because the cabinet 130 does not rest on the floor element 101 directly but is rather suspended in a position at a height, or spacing, 170 over the floor element, the cabinet 130 does not occupy any of the load positions 102 and the electrical loads 120 can be installed beneath the cabinet 130. Installing the cabinet 130 at the illustrated elevated position enables floor element 101 space which would be occupied by the cabinet 130 if the cabinet were resting on the floor element 101 to be released to be occupied by other elements, including one or more electrical loads 120 which could not be installed on the floor element 101 if the cabinet 130 were resting in direct physical contact with the floor element 101. As a result, the number of electrical loads 120 installed on the floor element 101 is increased as a result of supporting the cabinet 130 in the elevated position at height 170 over the floor element 101 instead of resting the cabinet 130 in direct physical contact with the floor element 101, thereby providing improved electrical load density in the load space 100 and improving utilization of one or more power sources, including one or more power distribution systems, which supply power to the particular load space 100, thereby reducing waste of infrastructure and capital expenditures.

In some embodiments, an enclosure gap 118 can be formed in a wall element 114 of structure 110, and a conduit 119 can be extended between the end of the cabinet 130 which faces the gap 118 and the gap 118 itself. Such an end of the cabinet 130 is referred to herein as a "rear" end of the cabinet 130, and the opposite end of the cabinet, shown in FIG. 1 to include the receptacles 138 and ATS module 137 ends, is referred to as a "front" end of the cabinet. The conduit 119, which can be referred to as a baffle element, is coupled to both the cabinet 130 and at least a portion of the wall element 114B and establishes a pathway between the rear end of the cabinet 130 and a region of the load space 100 which is located on an opposite side of the structure 110 from the region of the load space 100 in which the cabinet 130 and electrical loads 120 are located.

Exhaust air discharged by the cabinet 130, as a result of one or more air moving devices in the cabinet 130 inducing an airflow through the cabinet 130, from the front end to the rear end, which removes heat generated by one or more components in the cabinet 130, can be directed through the conduit 119 to the gap 118. The exhaust air directed to the gap 118 is directed to an opposite side of the structure 110, where the exhaust air discharged from the rear end of the cabinet 130 can mix with exhaust air discharged by the electrical loads 120 and is similarly partitioned from interaction with cooling intake air on the side of the structure 110 where the electrical loads 120 and cabinet 130 are located.

Figure 2:
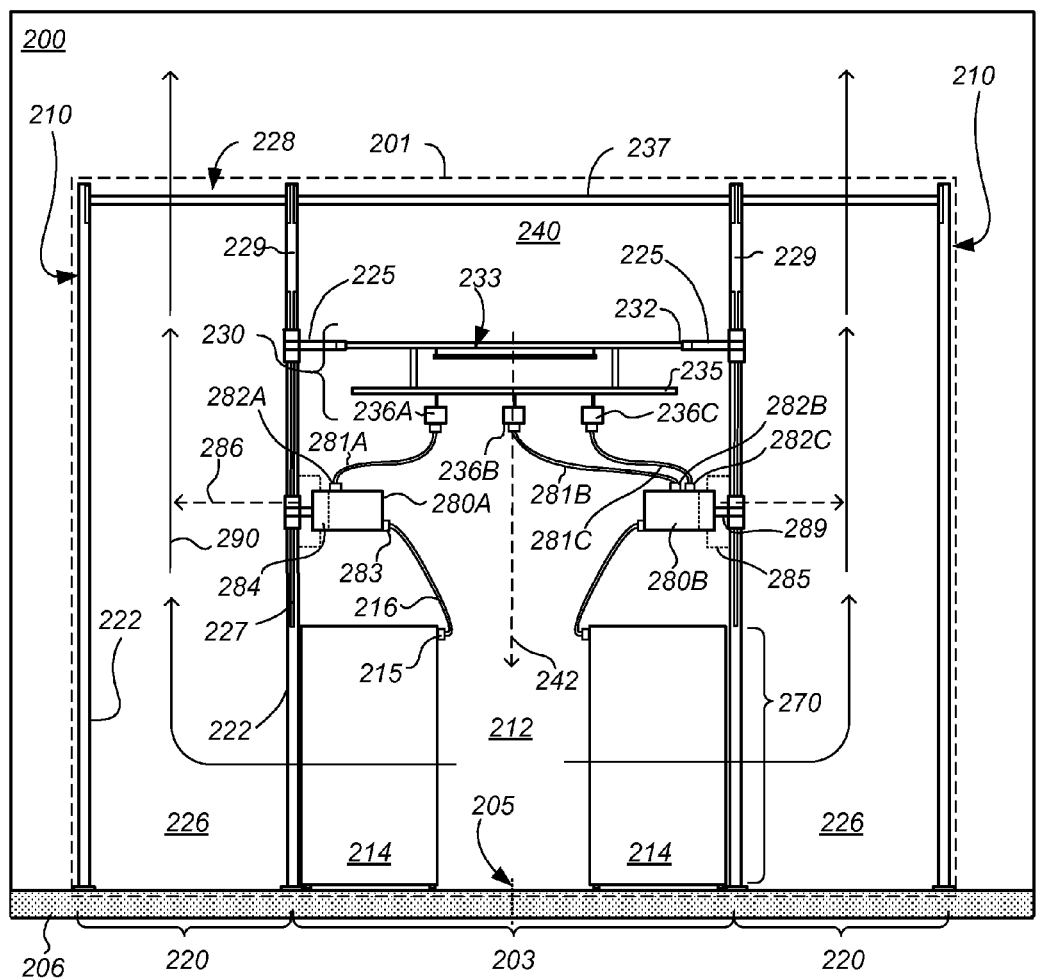
FIG. 2 is a schematic illustrating an orthogonal view of an electrical load space which includes separate rows of electrical loads extending along opposite sides of an aisle, free-standing structures which enclose exhaust air plenums on opposite sides of the aisle, and separate elevated ATS cabinets which are supported over separate rows of electrical loads by the separate free-standing structures and provide power redundancy support to separate electrical loads in the separate rows, according to some embodiments.

FIG. 2 is a schematic illustrating an orthogonal view of an electrical load space which includes separate rows of electrical loads extending along opposite sides of an aisle, free-standing structures which enclose exhaust air plenums on opposite sides of the aisle, and separate elevated ATS cabinets which are supported over separate rows of electrical loads by the separate free-standing structures and provide power redundancy support to separate electrical loads in the separate rows, according to some embodiments. The electrical load space 200 can be included in any of the embodiments of electrical load spaces herein.

Electrical load space 200, also referred to herein as a load space, includes a floor element 206. Space 200 further includes row infrastructure module 201. In some embodiments, where the electrical loads in the load space 200 include rack computer systems, the load space 200 can be referred to as a computer space. The row infrastructure module 201 is mounted in space 200 on at least a portion of floor element 206. The elevated ATS cabinets 280A-B can be included in any of the embodiments of elevated ATS cabinets included herein. The space 200 can include a computer space included in a data center, and one or more of the electrical loads installed in space 200 can include one or more rack computer systems.

Row infrastructure module 201, also referred to herein as "module 201", includes an enclosure space 212 that is at least partially bounded by various modular elements of module 201, including at least the illustrated free-standing structures 210 and module 230. The enclosure space 212 may herein be referred to as a "bounded enclosure 212". The bounded enclosure 212, in some embodiments, includes one or more heat producing components, including electrical loads 214. The one or more electrical loads 214 can, in some embodiments, include one or more rack computer systems into which computer systems (not shown) are installed, where the computer systems include one or more heat producing components. The computer systems may require cooling air, also referred to herein as cooling intake air, to remove heat from the heat producing components therein, thereby removing heat from the computer systems and mitigating the risk of damage to sensitive components from overheating. The computer systems may require various infrastructure elements for normal operation, including power distribution infrastructure, communication infrastructure, etc.

In some embodiments, module 201 is configured to provide cooling air to the bounded enclosure 212 to remove heat from one or more heat producing components mounted in the bounded enclosure 212. In some embodiments, a bounded enclosure that receives air for such heat removal is referred to as a "cold aisle", "cold aisle space", etc. The bounded enclosure may include a length of floor space (e.g., an "aisle") on which various components, including electrical loads 214, are mounted. The electrical loads 214 may be mounted in one or more rows, also referred to as set of electrical loads, in various portions of the bounded enclosure 212. As shown, the electrical loads 214 may be mounted on opposite sides of the bounded enclosure 212. In some embodiments, the electrical loads 214 are mounted to position front ends of the respective electrical loads 214 into the bounded enclosure 212 and the rear ends of the respective electrical loads 214 away from the bounded enclosure 212. In some embodiments, devices mounted in an electrical load 214 are configured to receive cooling intake air 242 for heat removal via the front end of the electrical load and discharge cooling exhaust air that has removed at least some heat from one or more heat producing components of the device via the rear end of the electrical load. Thus, cooling intake air can be received from the interior of the bounded enclosure 212 into the electrical loads 214, and exhaust air can be discharged out of the bounded enclosure 212.

In some embodiments, at least some of the bounded enclosure 212 is established by one or more modular elements of module 201. For example, as illustrated, where at least two free-standing exhaust plenum structures 210 are mounted in the interior space 202 of space 200 on floor element 206, the free-standing exhaust plenum structures 210 can be mounted on the floor 206 to establish side ends of the bounded enclosure 212. The structures 210 can be mounted in a spaced configuration, where the structures are mounted on opposite sides of a space 203 of the floor element. In some embodiments, module 201 comprises at least two sets of multiple structures 210 that each extend along opposite sides of a space 203. Where multiple structures 210 are coupled together on each of the opposite sides of the space 203 to establish respective sets of structures 210, the two or more sets of structures 210 may extend substantially in parallel with a particular axis 205 of the space 203. For example, where space 203 includes a substantially rectangular portion of the floor element 206, where the illustration of space 203 in FIG. 2 is a width of the space that is less than a perpendicular length of the space (not shown), the axis 205 extending along the length of the space may comprise a long axis of the space 203, so that the structures 210 mounted on opposite ends of the space extend substantially in parallel with the long axis 205 to establish side ends of the space 203. In some embodiments, establishing side ends of space 203 includes at least partially establishing side ends of the bounded enclosure 212.

In some embodiments, a top end of the bounded enclosure 212 is at least partially established by a plenum module 230. As shown, a plenum module 230 is mounted in the interior enclosure space 202 to rest upon at least a portion of separate support arm structures 225 of the separate free-standing exhaust plenum structures 210 mounted on opposite sides of space 203. The module 230 may comprise a panel element 232, a vent 233, etc. The panel element 232 may include a lower surface and an upper surface that restricts airflow between the surfaces beyond the vent 233. As a result, in some embodiments, a plenum module 230 can be coupled to separate free-standing exhaust plenum structures 210 that are themselves mounted on opposite side ends of space 203 to establish a top end of bounded enclosure 212 and a bottom end of another enclosure that can include a cooling air plenum 240. Coupling a plenum module 230 to a free-standing exhaust plenum structure 210 can including mounting the plenum module 230 on one or more support art structures 225 of the structure 210, where the plenum module 200 may rest upon one or more surfaces, including an upper surface, of the support arm structure and transmit at least apportion of the plenum modules 230 structural load to at least a portion of the structure 210 via support arm structure 225.

In some embodiments, module 201 includes various plenums that direct air to bounded enclosure 212 to provide intake air to the bounded enclosure, direct air from the bounded enclosure 212 to remove exhaust air from the bounded enclosure, some combination thereof, or the like. In the illustrated embodiments, a plenum duct 237 can be coupled to the separate free-standing exhaust plenum structures 210 to establish a top end of an enclosure, which can include a cooling air plenum 240, from which air can be directed into the bounded enclosure 212 as intake air 242. As shown, at least some ends of the cooling air plenum 240 can be established by the plenum module 230, free-standing exhaust plenum structures 210, plenum duct 237, etc. In some embodiments, where the plenum module 230 includes an enclosure structure that establishes top ends, bottom ends, and side ends of the plenum 240, a plenum duct 237 may be omitted from module 201. In the illustrated embodiment, cooling air plenum 240 is established via a lower surface of plenum duct 237, an upper surface of plenum module 230, and upper portions of the faces of the free-standing exhaust plenum structures 210 that face into space 203. Such faces can be referred to herein as "enclosure faces" of the respective structures 210.

In some embodiments, cooling air is received into cooling air plenum 240 and circulated through at least a portion of cooling air plenum 240. The cooling air can be directed from plenum 240 into the bounded enclosure 212 as cooling intake air 242 via one or more vents 233. In some embodiments, one or more vents 233 include one or more dampers which may be adjustably controllable to adjustably control the flow rate of intake air into at least a portion of the bounded enclosure. In some embodiments, the cooling air is directed through the vents via one or more gradients from the plenum 240 to the enclosure 212, including a pressure gradient, air density gradient, some combination thereof, or the like.

In some embodiments, one or more of the free-standing exhaust plenum structures 210 in module 201 includes a free-standing frame comprised of one or more frame members. As shown in the illustrated embodiment, the free-standing exhaust plenum structures 210 include frame members including vertical frame post members 222 and bracing frame members 224. The frame members can provide structural support and integrity to a given structure 210 and can establish a structural outline of the structure 210. In some embodiments, the structure 210 includes an interior space 220 that comprises an internal exhaust air plenum 226. The plenum 226 can receive exhaust air from rear ends of electrical loads 214 mounted in the bounded enclosure 212 to abut the respective enclosure face of the respective free-standing exhaust plenum structure 210. Exhaust air 290 can be received from one or more devices that include one or more heat producing components. The exhaust air 290 may comprise intake air that has passed through at least a portion of the electrical load 214 and removed heat from at least one of the heat producing components included in one or more devices mounted in the electrical load 214.

In some embodiments, a free-standing exhaust plenum structure 210 includes one or more wall elements that encompass at least a portion of one or more faces of the free-standing exhaust plenum structure. In the illustrated embodiments, at least the enclosure faces of the free-standing exhaust plenum structures 210 include wall elements 227, 229 that encompass respective portions of the enclosure faces of the structures 210. Wall element 227 can include one or more elements that encompass at least a portion of the enclosure face of the free-standing exhaust plenum structure to partition the interior of the free-standing exhaust plenum structure 210 from the bounded enclosure 212, thereby restricting flow of exhaust air from the internal exhaust air plenum 226 of the structure 210 into the bounded enclosure 212. In some embodiments, the wall element 227 extends from the portion of the free-standing exhaust plenum structure 210 at which the plenum module 230 is coupled to a portion where one or more racks 214 abut the enclosure face of the free-standing exhaust plenum structure 210. The enclosure face of the free-standing exhaust plenum structure 210 may include one or more gaps 270, including one or more gaps 270 where an electrical load 214 abuts the enclosure face, so that exhaust air 290 can pass from the rear end of the electrical load 214 into the plenum 226 of the free-standing exhaust plenum structure 210. One or more sealing elements may be coupled between a rack 214 and a wall element 227 of the proximate structure 210 to seal the interface between the wall element 227 and the structure of the electrical load 214 and to at least partially mitigate, prevent, etc. leakage of exhaust air from plenum 226 to bounded enclosure 212.

Wall element 229 can include one or more elements that encompass at least a portion of the enclosure face of the free-standing exhaust plenum structure 210 to partition the interior of the free-standing exhaust plenum structure 210 from at least the cooling air plenum 240, thereby at least partially restricting a flow of exhaust air from the internal exhaust air plenum 226 of the structure 210 into the cooling air plenum, thereby at least partially mitigating, preventing, etc. leakage of exhaust air 290 from plenum 226 to cooling air plenum 240 to mix with cooling air in the plenum 240. In some embodiments, the wall element 229 extends from the portion of the free-standing exhaust plenum structure 210 at which the plenum module 230 is coupled to a portion where one or more plenum ducts are coupled to the free-standing exhaust plenum structure 210. The enclosure face of the free-standing exhaust plenum structure 210 may include one or more gaps, so that at least some exhaust air can pass from the plenum 226 to mix with cooling air in plenum 240 to provide mixed air. The gaps may include one or more vents mounted in the enclosure face of the free-standing exhaust plenum structure 210, where such vents may include one or more sets of adjustably controllable dampers.

In some embodiments, a free-standing exhaust plenum structure 210 includes one or more exhaust vents 228 through which exhaust air 290 can be directed from an internal exhaust air plenum of the free-standing exhaust plenum structure 210 to an environment external to module 201. The external environment can include interior space 202, interior space exhaust plenum 204, etc. The exhaust air 290 can be directed through the vents 228 via one or more of a pressure gradient between the plenum 226 and the external environment, an air density gradient, a chimney effect, some combination thereof, or the like.

In some embodiments, one or more free-standing exhaust plenum structures 210 in module 201 include multiple enclosure faces. Each of the multiple enclosure faces can include one or more wall elements 227, 229, support arm structures 225, etc. As a result, a given free-standing exhaust plenum structure 210 can be mounted on a side of multiple spaces 203, where one face of the structure 210 faces one space 203 and another face, which may be an opposite face, faces another separate space 203. The plenum 226 of a given structure 210 may receive exhaust air from two or more separate electrical loads 214 that are each mounted in separate bounded enclosures 212. As a result, module 201 may include multiple bounded enclosures 212 that are each at least partially bounded by one or more structures 210, modules 230, etc.

In some embodiments, module 201 includes one or more support elements that support one or more infrastructure elements. The support elements can include one or more rails, trays, busways, etc., which may be coupled to one or more various modular elements of module 201. In the illustrated embodiment, for example, plenum module 230 includes a support tray 235 and a plurality of busways 236A-C that can carry separate power feeds from one or more power sources, including one or more primary power sources, secondary power sources, reserve power sources, some combination thereof, etc.

Space 200 includes two separate elevated ATS cabinets 280A-B which are installed in elevated positions over separate portions of the bounded enclosure 212 and are electrically coupled to one or more various power feeds and one or more various electrical loads 214. The separate elevated ATS cabinets 280A-B include one or more sets of ATS modules (not shown in FIG. 2) which are configured to provide power support, via power received from the one or more coupled power feeds, to the one or more coupled electrical loads 214.

Each elevated ATS cabinet 280 includes a mounting arm element 289 which is coupled to a frame member 222 of a separate free-standing structure 210 in a configuration which positions the cabinet 280 within the bounded enclosure 212. As a result, the separate structures 210A-B each structurally support a separate one of the elevated ATS cabinets 280A-B in respective elevated positions over the separate electrical loads 214 which are proximate to the respective structures 210. In addition, each cabinet 280 includes at least one cabinet inlet receptacle 282 which is configured to couple to a power transmission line 281 that is coupled to a busway 236, where the busway carries electrical power from a power feed. Furthermore, each cabinet 280 includes at least one cabinet outlet receptacle 283 which is electrically coupled to a power interface 215 of a particular electrical load 214 via a power conduit 216 which extends between the cabinet 280 and the electrical load 214. In some embodiments, a conduit 215 includes a power cable of an electrical load 214. Each cabinet 280 can include multiple receptacles 283 which can each be coupled separately to separate electrical loads 214.

Each cabinet includes a set of ATS modules which are each configured to provide power support to the various electrical loads 214 which are coupled to the various receptacles 283 of the cabinet 280, via power received from one or more various power feeds via the various receptacles 282. In some embodiments, a cabinet 280 is configured to receive power from various separate power feeds. For example, in the illustrated embodiment, cabinet 280A includes a single receptacle 282A which is coupled to an individual busway 236A of the three busways 236 extending through enclosure 212, via an individual power transmission line 281A. As a result, cabinet 280A is configured to provide power support to one or more electrical loads 214 on the same side of enclosure 212 as the cabinet 280A from an individual power feed received from busway 236A.

In another example, cabinet 280B includes multiple receptacles 282B-C which are each coupled, via separate lines 281B-C, to separate busways 236B-C which are separate from the busway 236A to which cabinet 280A is coupled. The separate busways 236B-C can carry separate power feeds from separate power sources, including separate power distribution systems. As a result, cabinet 280B is configured to provide power support, to one or more electrical loads 214 from a selected one of multiple power feeds received via the separate receptacles 282B-C. The cabinet 280B can include ATS modules which are configured to selectively distribute power received from a selected one of the receptacles 282B-C to the coupled electrical loads 214.

Each cabinet 280 includes at least one air moving device assembly 284 which is included in a rear portion of the cabinet and is configured to induce an airflow through the respective cabinet which draws air 242 from enclosure 212 into the cabinet 280 housing and removes heat generated by one or more heat generating components in the cabinet 280. The assembly 284 can further induce the airflow to be discharged, as an exhaust air flow 286, from a "rear" end of the cabinet which is proximate to the structure 210 to which the cabinet 280 is coupled, as shown.

In some embodiments, a baffle element 285 can be extended from the rear end of a cabinet 280 to a gap, referred to herein as an enclosure gap, in a wall element 227 in the structure, thereby establishing a conduit via which the exhaust air flow 286 can be directed via operation of the assembly 280 into the plenum 226 at least partially enclosed by the structure 210 to which the cabinet 280 is coupled. As a result, exhaust air 286 produced as a result of removing heat from components in the elevated ATS cabinets can be partitioned from interacting with the air 242 in the enclosure 212, thereby mitigating such exhaust air 286 from being drawn into the electrical loads 214, where the exhaust air might otherwise hamper cooling of the electrical loads 214.

Figure 3:
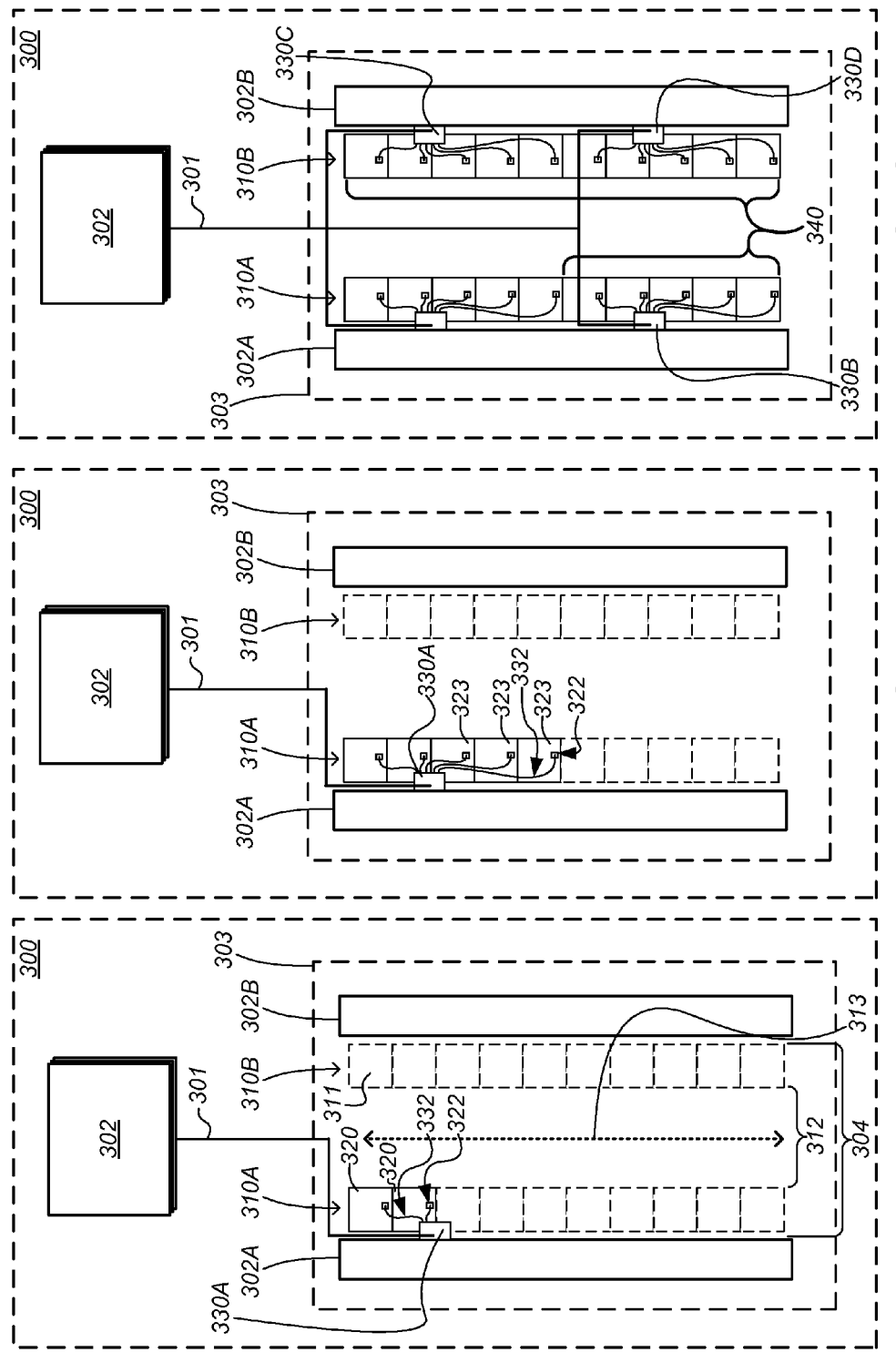
FIG. 3A-C are schematics illustrating orthogonal views of a facility which includes an electrical load space where separate sets of electrical loads and elevated ATS cabinets are incrementally installed, according to some embodiments.

FIG. 3A-C are schematics illustrating orthogonal views of a facility 300 which includes an electrical load space where separate sets of electrical loads and elevated ATS cabinets are incrementally installed, according to some embodiments. The elevated ATS cabinets 320A-D can be included in any of the embodiments of elevated ATS cabinets included herein. The facility 300 can include a data center, the load space 303 can include a computer space included in a data center, and one or more of the electrical loads installed in load space 303 can include one or more rack computer systems. As shown, the facility 300 includes one or more power sources 302, which can include one or more power distribution systems, which are coupled to one or more instances of power transmission lines 301, which can include one or more sets of power busways, power cables, etc., which electrically couple the one or more power sources to ATS cabinets installed in the load space 303.

As shown, FIG. 3A-C illustrate incremental installation of electrical loads 320, 323, 340 in the load space 303 and incremental installation of elevated ATS cabinets 330A-D in the space in response to the incremental load installation, so that the amount of support infrastructure provided by ATS cabinets which is installed in the space 303 at any given time corresponds to the amount of loads which are installed, inbound to be installed, etc. Because the ATS cabinets 330 are incrementally installed based on load installation, rather than installing the ATS cabinets 330A-D initially prior to load installation, the capital expenditures associated with ATS cabinet installation can be deferred until the support provided by the individual cabinets is required to support loads which are actually being installed in the load space.

As shown, the load space 303 includes an aisle space 304 which includes an aisle 312 that extends along a long axis 313 and is bounded by two separate rows 310A-B of load positions 311. Each separate load position 311 is configured to accommodate a separate electrical load having a surface area, or "footprint", which corresponds to the area of the position 311. The aisle space 312, positions 311, etc. can all be located on a floor element.

As further shown, separate free-standing structures 302A-B extend along opposite sides of the aisle space 304, where each structure 302 extends along a side of a separate row 310 of load positions which is distal from the aisle space 312. Each free-standing structure 302 can include one or more frame members which support the respective structure 302 on the floor element of the space 303 and one or more enclosure elements, including plating, cladding, etc. which at least partially encloses an exhaust air plenum within the respective structure 302. Each free-standing structure 302 can include a free-standing exhaust plenum structure which at least partially encloses an exhaust air plenum, where the structure 302 is configured to direct exhaust air received from electrical loads installed in a proximate row 310 from the aisle space 304 into the exhaust plenum in the structure 302.

As further shown, the rows 310A-B and free-standing structures 302A-B extend in parallel with the long axis 313 of the aisle 312.

FIG. 3A illustrates the space 303 where an initial set of electrical loads 320 are installed in the space 303. The initial set of loads 320 includes two loads which require power support. As a result, an elevated ATS cabinet 330A is installed in the space 303, where such installation includes electrically coupling one or more ATS modules included in the cabinet 330A to a power feed 301, and coupling the one or more ATS modules in the cabinet 330A to separate power interfaces 322 of the separate electrical loads 320 via separate instances of power conduits 332, which can include separate instances of power cabling extending between the cabinet 330A and the separate electrical loads 320.

In some embodiments, the cabinet 330A is configured to include a greater quantity of ATS modules than the quantity of ATS modules required to provide power support to the installed loads 320. For example, the cabinet 330A can be configured to include five ATS modules, where each ATS module is configured to provide power support to a separate electrical load, and only two loads 320 are initially installed in space 303. In some embodiments, the ATS modules are incrementally installed in an installed cabinet 330A based on the quantity of ATS modules required to be included in the cabinet to support installed electrical loads in the space 303. In FIG. 3A, since only two electrical loads 320 are installed, installed cabinet 330A may include only two installed ATS modules and may further include three empty ATS module slots in which additional ATS modules can be installed later.

As shown, the cabinet 330A is installed in an elevated position above the electrical loads 320 and proximate to the electrical loads 320, so that the amount of power conduits required to extend between the cabinet 330A and the electrical loads 320 is reduced. In some embodiments, the branch circuits are excluded from the conduits 332 which can couple the loads and cabinets 330, which can result in reduced capital expenditures.

FIG. 3B illustrates additional electrical loads 323 being installed in an additional set of positions 311 in row 310A of space 303. As shown, the additional loads 323 are coupled with receptacles of the installed elevated ATS cabinet 330A via power conduits 332 extending between receptacles of the cabinet 330A and power interfaces 322 of the loads 323. In some embodiments, including the embodiment illustrated in FIG. 3B, an elevated ATS cabinet includes a quantity of slots into which ATS modules can be installed, where separate ATS modules are configured to provide one or more of power support, power redundancy support, etc. to separate electrical loads.

As discussed above with reference to FIG. 3A, the quantities of ATS modules installed in a cabinet can be incrementally adjusted based on incremental changes in the quantities of electrical loads installed in the space proximate to the cabinet. For example, where cabinet 330A includes five ATS module slots configured to accommodate five separate ATS modules, the cabinet 330A, in FIG. 3A, may include two ATS modules installed in two of the slots and three empty slots, where the two installed ATS modules provide power support to the two installed electrical loads 320, so that the quantity of installed ATS modules matches the quantity of ATS modules required to support the installed loads. As a result of only installing a quantity of ATS modules which matches the quantity of installed loads in a space, capital expenditures associated with installing ATS modules in the space can be deferred until the ATS modules are actually required to provide power support to installed electrical loads.

In FIG. 3B, an additional three loads 323 are installed in space 303. Where cabinet 330A includes an additional three slots, an additional three ATS modules can be installed in the cabinet 330A and coupled to the additional electrical loads 323. As a result, the ATS cabinet 330A is fully utilized, as all slots are occupied by ATS modules, and all installed ATS modules are providing power support to installed loads 320, 323 in the space 303.

In some embodiments, a given elevated ATS cabinet is configured to provide support to a limited selection of electrical loads which can be installed in a space. Where the quantity of loads installed in a space is less than the maximum quantity of electrical loads which can be installed in the space, excess cabinet capacity which would be required to support the maximum quantity of loads which can be installed in a space would go unused, thereby contributing to capital expenditure waste. Where an elevated ATS cabinet is configured to provide power support to a limited selection of electrical loads which can be installed in a space, capital expenditure waste can be reduced, relative to a cabinet which is configured to provide power support to the maximum number of loads which can be installed in a space, as the excess, unused cabinet capacity for ATS modules at any given time is lessened. Excess, unused ATS module capacity can include power support capacity which is not fully utilized, air moving device capacity which is not fully utilized based on heat generating components operating at less than full capacity, portions of the cabinet which can accommodate ATS modules yet are not presently accommodating ATS modules that are presently supporting loads, etc.

In some embodiments, installing multiple elevated ATS cabinets which are each configured to support a limited selection of loads in a space, and which collectively support the maximum number of loads which can be installed in a space, enables incremental installation of ATS cabinets, and the support and infrastructure provided thereby, which corresponds to incremental installation of electrical loads in the space. As a result of incrementally installing ATS cabinets in the space, at least some capital expenditures associated with ATS cabinet installation can be deferred until needed to support installed electrical loads, thereby mitigating waste.

As shown in the FIG. 3C, additional loads 340 are installed in rows 310A-B of space 303, thereby resulting in all positions 311 being occupied by electrical loads so that the maximum quantity of electrical loads are installed in space 303. In the illustrated embodiments, cabinet 330A is configured to provide support to a limited selection of five electrical loads, and since the cabinet 330A capacity of ATS modules is fully utilized by installed loads 320, 323, the cabinet 330A has no remaining excess capacity of ATS modules to provide power support to the additional electrical loads 340.

As a result, based on installation of the additional electrical loads in space 303, additional elevated ATS cabinets 330B-D are installed in the space 303. As shown, the various additional cabinets 330B-D are installed at various positions in the space 303 which causes the individual cabinets 330B-D to each be located proximate to a separate limited selection of loads to which the individual cabinets can provide power support. Each separate cabinet 330B-D, similarly to cabinet 330A, is configured to support five loads, and each cabinet 330B-D is coupled to a separate limited selection of five of loads 340.

As further shown, cabinets 330C-D which provide support to the loads 340 installed in row 310B are installed at elevated positions which are proximate to row 310B, rather than positions proximate to row 310A. As a result of installing an elevated ATS cabinet at an elevated position which is proximate to the limited selection of loads in a space to which the cabinets provide support, the amount of power conduit instances required to be extended between the cabinet and the supported loads, including the cumulative length of power conduits, is reduced, thereby reducing capital expenditures.

In addition, because each individual cabinet 330A-D is installed proximate to the limited selection of electrical loads supported by the individual cabinet 330, the types of power conduits which can be utilized to couple the cabinet 330 to the electrical loads can be reduced, in complexity, capacity, etc. relative to power conduits which provide support across greater distances. For example, the various conduits 332 which couple each of the cabinets 330A-D with separate loads can include power cables of the individual electrical loads, thereby precluding use of branch circuits to couple the cabinets to the loads. By enabling power support to be provided from ATS cabinets to electrical loads independently of branch circuits, the elevated ATS cabinets provide capital expenditure savings, as the expenditures associated with the branch circuits can be eliminated.

In some embodiments, installing an elevated ATS cabinet 330 includes coupling one or more mounting arm elements of the cabinet 330 to one or more frame members of a free standing structure 302, so that the structure supports the cabinet 330 in a suspended, elevated position over one or more load positions in the space 303. As a result, the cabinet 330 is precluded, released, etc. from occupying one or more portions of the floor elements included in the space 330, including one or more of the positions 311. This enables an electrical load to be installed in a position which might otherwise be occupied by an ATS cabinet, thereby enabling additional load density in the space 330, more efficient utilization of installed power sources, available volume space in space 303, etc.

In some embodiments, installing an elevated ATS cabinet 330 includes coupling an end of the ATS cabinet 330 to an enclosure gap in the free standing structure 302 to which the cabinet 330 is coupled, thereby establishing a partitioned conduit between the end of the cabinet 330 to a plenum at least partially enclosed within the structure 302. As a result, exhaust air discharged from the end of the ATS cabinet 330, based on operation of one or more air moving device assemblies in the cabinet 330, is directed into the plenum without interacting with air located within the space 304 in which the installed cabinet is located. Such directing of exhaust air into the plenum mitigates exhaust air from the ATS cabinet from interacting with air in space 304 which can be utilized as cooling intake air by one or more loads in the space 304, thereby augmenting cooling of the loads in the space 304.

FIG. 4A-B are schematic diagrams illustrating orthogonal views of an elevated ATS cabinet, according to some embodiments. The elevated ATS cabinet 400 can be included in any of the embodiments of elevated ATS cabinets included herein.

Cabinet 400 includes a housing 401, which includes various components described further herein, and a set of mounting arm elements 402A-B which extend from a rear end 470B of the housing 401. Each mounting arm element 402 includes a coupling element 404 which is configured to couple to at least one frame member of a free-standing structure, and at least one load-bearing arm 403 which is configured to transfer the structural load of the housing 401 and components included therein to the frame element to which the coupling element 404 is coupled.

Housing 401 includes multiple sets 405A-C of ATS module slots 406 which can each accommodate a separate ATS module 410, multiple removable air moving device assemblies 480A-C which can induce airflow which removes heat from various portions of the housing 401, power feed inlets 421 which can receive power feeds from separate power sources, power bus systems 422A-B which can carry separate power feeds, sets 440A-C of cabinet outlet receptacles 442A-C which can couple with separate electrical loads, and connectors which can electrically couple modules 410 installed in separate slots 406 to the separate power bus systems and electrical loads, so that the installed modules 410 provide one or more of power support, power redundancy support, etc. to one or more electrical loads.

Housing 401 includes a set of cabinet inlet receptacles 421A-B which are each configured to couple with separate power feeds 420A-B from one or more various power sources. The separate feeds 420A-B can carry power feeds from separate power sources. As show, housing 401 includes separate power bus systems 422A-B, each of which can include one or more power buses, power transmission lines, etc., which are each coupled to separate cabinet inlet receptacles 421A-B and thus can carry electrical power from separate power feeds 420A-B coupled to the separate receptacles 421A-B.

As shown, each separate set 405 of slots 406 can include one or more sets of slot members 407 which partition an interior of the housing into the separate slots 406. The illustrated slots 406 extend to a front end 470A of the housing 401, and an ATS module 410 can be slidably engaged into an open end of a slot 406 via the front end 470A.

As shown, each power bus system 422A-B which carries a separate power feed includes a separate set of slot power feed connectors 424A-B which extends into the separate slots 406. In some embodiments, each slot power feed connector 424 includes a blind mate connector. As a result, connectors which couple with one or more connectors 424 are electrically coupled to one or more power feeds via the connectors.

In some embodiments, each power bus system 422 carries a multi-phase power feed, and separate sets of connectors 424 extending from the system 422 into slots 406 included in separate sets 405 are each configured to carry separate phases of the power feed carried by the given system. For example, separate sets of connectors 424A extending from system 422 into slots 406 of separate sets 405A-C can carry separate phases of the power feed 420A carried by system 422.

As shown, housing 401 includes separate sets 440A-C of cabinet outlet receptacles 422, where each receptacle 422 in a given set 440 is electrically coupled, via a set of power transmission lines 434, 436 through the housing 401, to a slot outlet connector 432 in a slot which is configured to supply power received from an ATS module 410 in the given slot 406 to the individual receptacle 442 which is coupled to the connector 432. Each separate receptacle 442 can be configured to physically couple with a power conduit extending from a separate electrical load, where the electrical load includes one or more rack computer systems.

The power conduit extending from a load can include a power cable which terminates in a power cable connector, where a receptacle 442 is configured to couple with the power cable connector. For example, each receptacle 442 can include an L630 receptacle configured to couple with an L630 connector. As a result, an electrical load can be electrically coupled to a receptacle 442, and thus electrically coupled to an installed ATS 410 electrically coupled to the receptacle via coupled connector 432, independently of any branch circuits between the receptacle 442 and the electrical load. As shown, each set 440 can include a separate locking element 444 which is associated with a separate receptacle 442 and is configured to secure a power conduit which is coupled to the separate receptacle. For example, locking elements 444 can each include a separate lance bridge which can secure a power cable which is coupled to a corresponding receptacle 442, thereby mitigating a risk of the cable becoming inadvertently decoupled from the receptacle 442.

As shown, one or more ATS modules 410 which can be installed in a slot 406 can include ATS inlet connectors 412A-B, inlet lines 414A-B which feed power from separate connectors 412A-B, an ATS 416 which can selectively distribute power received from a selected one of lines 414A-B, an outlet line 418, and an ATS outlet connector 419 which can distribute power distributed by the ATS 416 via line 418. As shown, one or more of connectors 412A-B, 419 can include separate blind mate connectors which can be coupled with corresponding connectors 424A-B, 432 based on the module 410 being slidably engaged into the slot 406 from the opening of the slot 406 at the front end 470A, so that connectors 412A and 424A establish a blind mate connection which electrically couples ATS 416 with the power feed carried by system 422A, connectors 412B and 424B establish a blind mate connection which electrically couples ATS 416 with the power feed carried by system 422B, and connectors 432 and 419 establish a blind mate connection which electrically couples ATS 416 with a particular cabinet outlet receptacle 442.

In some embodiments, an ATS is absent from an ATS module, and the ATS module comprises one or more instances of circuitry which electrically couple at least one inlet connector of the module with an outlet connector 419 of the respective ATS module. Such an ATS module can be referred to as one or more of a pass-through module, a bypass module, etc. A bypass module can electrically couple a particular cabinet outlet receptacle which is coupled to an outlet connector 432 of a particular slot 406 to a particular power feed independently of an ATS. Because the bypass module electrically couples the cabinet outlet receptacle to a particular power feed, rather than an ATS which selectively supplies electrical power from a particular one of multiple power feeds, the bypass module can provide N power redundancy support to an electrical load coupled to the cabinet outlet receptacle which is coupled to the particular power feed via the bypass module, instead of 2N, 3N, N+1, N+2, etc. power redundancy support which can be provided to an electrical load which receives power support via an ATS.

In the illustrated embodiment shown in FIG. 4B, the ATS module 410C installed in the module slot 406C is a bypass module which comprises an instance of electrical circuitry 411 which electrically couples the inlet connector 412B of the module 410C with the outlet connector 419 of the module 410C independently of any ATS 416.

Based on the slot connectors included in a slot 406 and ATS module connectors including blind mate connectors, an ATS module 410 can be reversibly installed, removed, replaced, swapped, etc. based on slidably moving the module 410 in or out of a given slot 406. In some embodiments, the ATS module 410 can be hot-swapped.

In some embodiments, each set 405A-C of slots 406 is associated with a corresponding set 495 of circuit breakers 496 which are each configured to electrically isolate an ATS module 410 installed in a separate slot 406 in the given slot set 405 from a corresponding receptacle 442. In some embodiments, each set 405A-C of slots 406 is associated with a corresponding set 495 of circuit breakers 496 which are each configured to electrically isolate an ATS module 410 installed in a separate slot 406 in the given slot set 405 from one or more power feeds 420A-B.

The breakers 495 are each accessible via the same front end 470A of the housing 401 on which the openings of the slots 406 are located, so that ATS modules 410 installed in the slots 406 and the corresponding circuit breakers 496 associated with said slots 406 are accessible from a common side of the housing 401, which can improve accessibility and maintenance of the power support, power redundancy support, etc. provided to loads via the cabinet 400.

As shown, each set 405A-C of slots 406 is associated with a separate bypass device 490. The bypass device 490 can be configured to selectively bypass a power feed around one or more particular selected installed ATS modules 410, so that the bypassed power feed is directed to a corresponding receptacle 442 which is coupled to the selected modules 410, and the selected modules 410 are electrically isolated from the power feeds and the receptacle 442. The bypass device 490, in some embodiments, executes the bypassing based at least in part upon controlling operation of one or more circuit breakers 496 associated with the one or more slots 406 in which the one or more selected modules 410 are installed. The device 490, in some embodiments, autonomously selects a module 410 and executes bypassing of the selected module 410 based at least in part upon determining an occurrence of a failure associated with the ATS module 410. In some embodiments, the device 490 bypasses a selected module 410 based on user interaction with a portion of the device 490 which includes specification of the selected module 410 and a command to bypass the selected module 410. In some embodiments, the device 490 removes bypassing of a module 410, based at least in part upon user interaction with one or more interfaces of the cabinet 400.

In some embodiments, cabinet 400 includes a selector device which selects a set of installed ATS devices and commands the bypass device 490 to activate, deactivate, etc. a bypass of the selected ATS devices. In some embodiments, the selector device is at least partially incorporated into the bypass device 490. In some embodiments, the selector device includes one or more user interfaces via which a user can manually interact to specify the set of ATS devices and command activation, deactivation, etc. of a bypass of the set of ATS devices. As a result, the selector device can command the bypass device to selectively activate, deactivate, etc. a bypass of one or more particular selected ATS modules based on user interaction with one or more user interfaces of the selector device.

Figure 4:
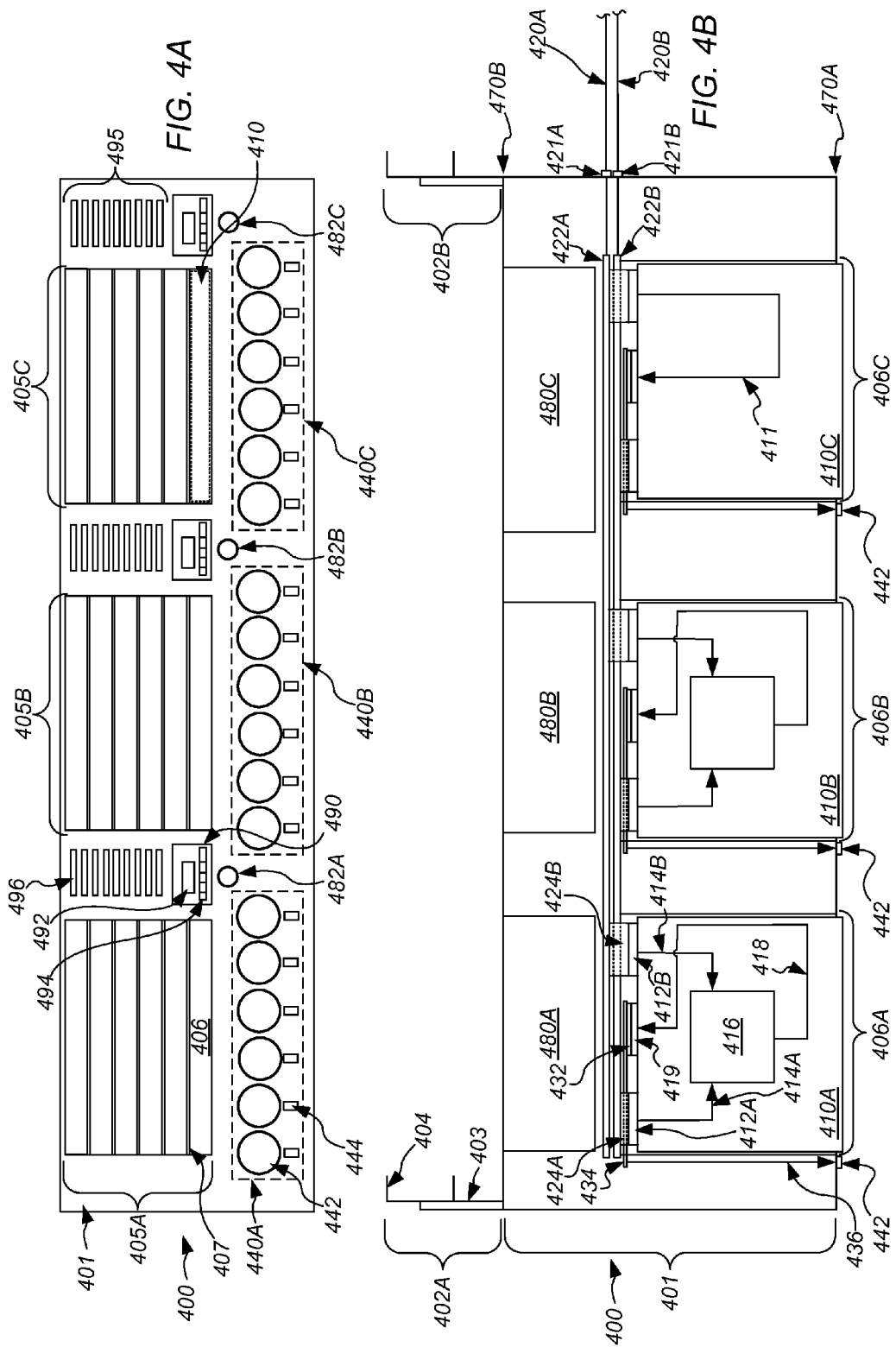
FIG. 4A-B are schematic diagrams illustrating orthogonal views of an elevated ATS cabinet, according to some embodiments.

In the illustrated embodiment of FIG. 4, a selector device 492 is incorporated into the bypass device 490 and includes a user interface 494 via which a user can interact with the selector device 492. In some embodiments, the user interface includes one or more of a display interface, a set of one or more touch interfaces, etc. In some embodiments, an indication can be provided, via a display interface 494 of a selector device 492, of the bypass state of one or more ATS modules 410 in one or more sets 405 of slots 406.

As a result of bypassing an ATS module 410, the bypass device 490 enables continuous power support to be provided to an electrical load, via a corresponding receptacle 442, when the module 410 is removed, replaced, swapped, etc. Where the electrical load includes a rack computer system, providing continuous power support enables uninterrupted performance of computing operations by the rack computer system.

In some embodiments, cabinet 400 includes various air moving device assemblies 480A-C which each include one or more air moving devices which are configured to induce an airflow through one or more portions of the housing 401, thereby removing heat from one or more heat generating components included in the housing. As shown, the separate assemblies 480A-C are arranged proximate to separate sets 405 of slots, so that each assembly 480A-C is configured to generate a separate airflow which removes heat generated by ATS modules 410 installed in the separate sets 405 of slots 406. As shown, the assemblies 480A-C can induce airflow which enters the cabinet 400, as intake air, via the front end 470A and exits the cabinet 400, as exhaust air, via the rear end 470B. In some embodiments, one or more of the assemblies can be reversibly installed, removed, swapped, etc. as separate modules, which augments maintenance of the cabinet 400 by simplifying assembly 480 maintenance.

In some embodiments, cabinet 400 includes a set of indicators 482A-C which each provide a visually-observable indication of an operation state of a corresponding air moving device assembly 480A-C. For example, an indicator 482 can present a visual indication which includes a particular color of light, based on a determination at one or more computer systems included in the cabinet 400 regarding whether a failure has occurred in a corresponding air moving device assembly 480.

Figure 5:
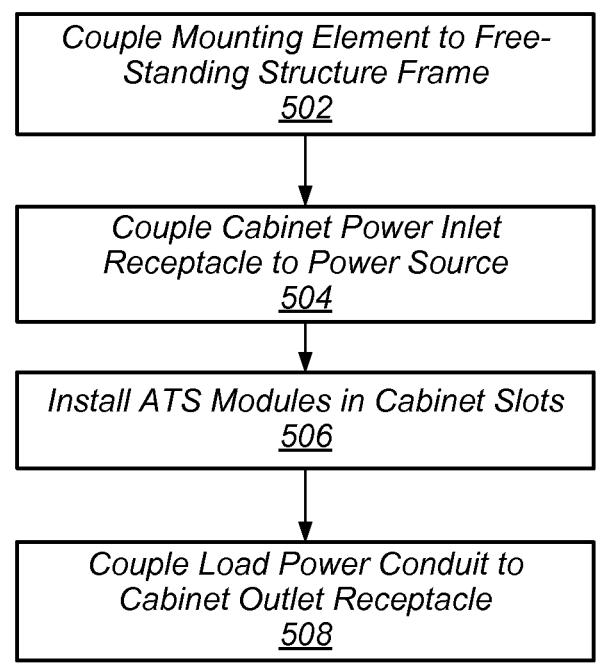
FIG. 5 is a flow diagram illustrating configuring an elevated ATS cabinet to provide power redundancy support to one or more electrical loads in an electrical load space, according to some embodiments.

FIG. 5 is a flow diagram illustrating configuring an elevated ATS cabinet to provide power redundancy support to one or more electrical loads in an electrical load space, according to some embodiments. The configuring can be implemented with regard to any of the embodiments of elevated ATS cabinets.

At 502, a mounting arm element included in the elevated ATS cabinet is coupled to a frame member included in a free-standing structure. The mounting arm element is coupled to the housing of the elevated cabinet and is configured to transmit the structural load of the housing and the components which can be included in the housing to the frame to which the mounting arm element is coupled. Components which can be included in the housing can include one or more ATS modules, slots, connectors, power bus systems, etc.

Coupling the mounting arm element of the elevated ATS cabinet to the frame member of the results in the free-standing structure providing structural support to the elevated ATS cabinet. The coupling 502 can include coupling the mounting arm element to the frame where the cabinet is located at an elevated position in a load space which includes a floor element, where the elevated position is located over one or more load positions on the floor element and at a height over the floor element which is greater than the upper height of loads which can be installed in the one or more load positions. As a result, the elevated ATS cabinet is suspended in the elevated position over the load positions as a result of coupling the mounting arm element to the frame.

At 504, one or more cabinet power inlet receptacles included in the elevated ATS cabinet are coupled to one or more power transmission lines which are electrically coupled to one or more power sources and carry electrical power feeds from the one or more power sources, where the one or more cabinet power inlet receptacles are coupled to one or more power bus systems included in the cabinet, so that the one or more power bus systems become electrically coupled to the one or more power sources and carry electrical power received from one or more various electrical power feeds.

At 506, one or more ATS modules are installed in one or more ATS module slots of the cabinet. An ATS module can include one or more ATS inlet connectors which is configured to couple with one or more slot power feed connectors in an ATS module slot, where the one or more slot power feed connectors are coupled to one or more separate power bus systems, so that coupling the ATS inlet electrical connectors to the one or more slot power feed connectors results in electrically coupling one or more inlet lines of an ATS included in the ATS module with the one or more power bus systems included in the cabinet, thereby electrically coupling the ATS to one or more various power feeds carried by the one or more power bus systems.

In some embodiments, the slot power feed connectors and the ATS inlet connectors of an ATS module are blind mate connectors which are configured to be coupled together as a result of slidably engaging the ATS module into an end of the ATS module slot which is distal from another end of the ATS module slot which includes the slot power feed electrical connectors.

In some embodiments, installing the ATS module in an ATS module slot includes coupling an ATS outlet connector of the ATS module with a slot outlet connector, so that the outlet of the ATS is electrically coupled to a portion of the cabinet which is configured to route electrical power from the ATS outlet connector to a cabinet outlet receptacle which can couple to an electrical load. The ATS outlet connectors of the module and the slot outlet connectors can be blind mate connectors. As a result, installing the ATS module into the slot can include slidably engaging the ATS module into the slot which causes the ATS inlet and outlet blind mate connectors of the module to be electrically coupled to one or more power feeds and cabinet outlet receptacles, respectively, via respective blind mate connections established between the ATS inlet and outlet connectors of the ATS module and the slot power feed and outlet connectors of the slot.

At 508, one or more electrical loads are electrically coupled to one or more ATS modules included in the cabinet, via coupling one or more power conduits extending from a power inlet interface of the one or more electrical loads to one or more cabinet outlet receptacles which are electrically coupled to the one or more ATS modules. The one or more power conduits can include one or more power cables which terminate in one or more power cable connectors, and the coupling can include coupling separate power cable connectors, of separate power cables extending from separate loads, to separate cabinet outlet receptacles which are coupled to separate ATS modules, so that the separate loads are electrically coupled to the separate ATS modules.

In some embodiments, coupling power cables extending from power interfaces of separate loads to separate cabinet outlet receptacles of a cabinet results in electrically coupling one or more electrical loads to one or more ATS modules in the cabinet, such that the cabinet provides one or more of power support, power redundancy support, etc., independently of any branch circuits between the cabinet and the electrical loads, as the power conduits between the cabinet and loads can be restricted to one or more power cables extending between the cabinet outlet receptacles of the cabinet and the power interfaces of the one or more loads.

Figure 6:
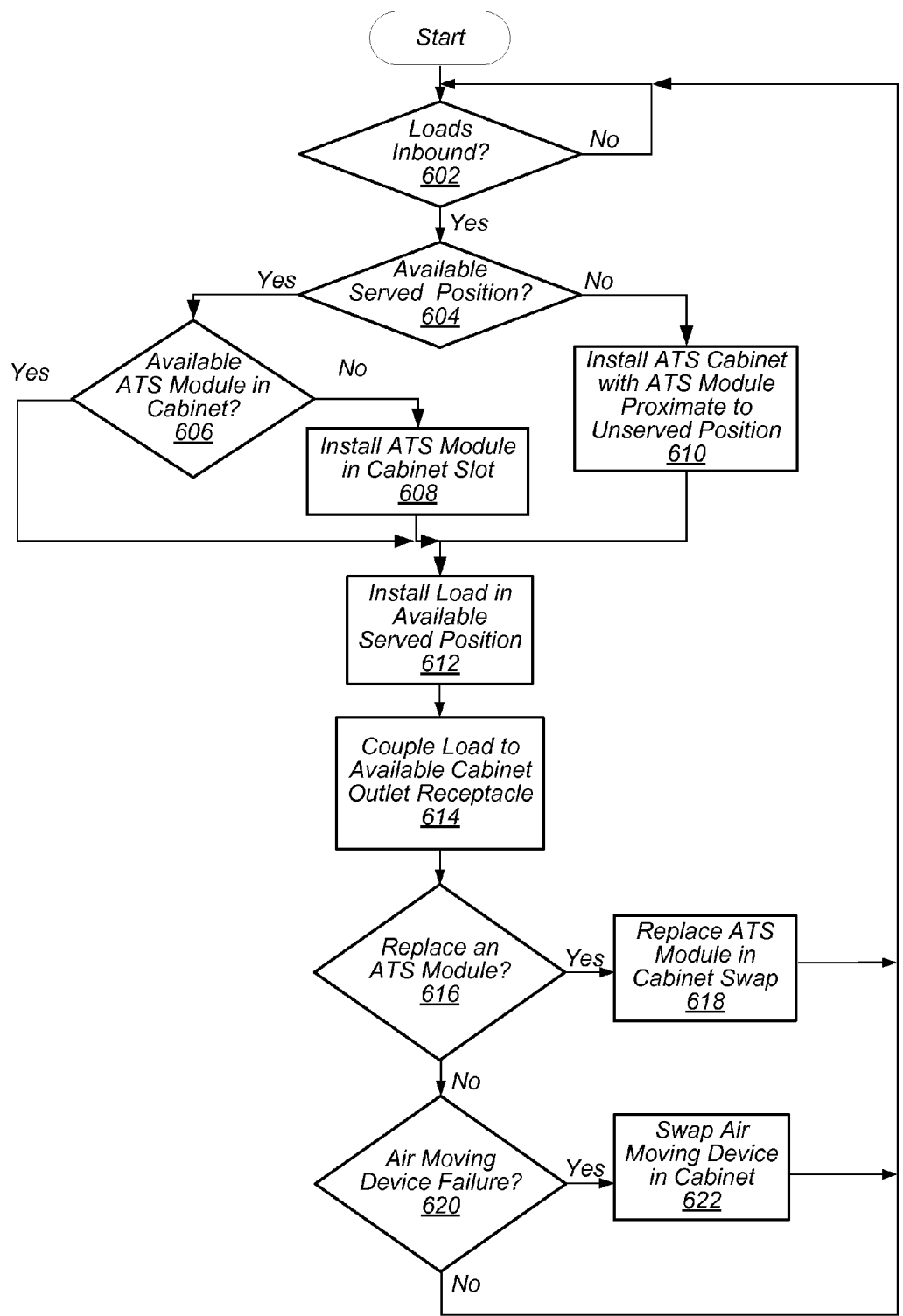
FIG. 6 is a flow diagram illustrating incrementally adjusting power redundancy support provided by one or more elevated ATS cabinets to one or more electrical loads in an electrical load space, according to some embodiments.

FIG. 6 is a flow diagram illustrating incrementally adjusting power redundancy support provided by one or more elevated ATS cabinets to one or more electrical loads in an electrical load space, according to some embodiments. The incremental adjustment can be implemented with regard to any of the embodiments of elevated ATS cabinets. In some embodiments, some or all of the incremental adjustment can be implemented by one or more computer systems.

At 602, a determination is made regarding whether one or more electrical loads are inbound to be installed in a load space. The determination can be made based at least in part upon one or more of physical arrival of the electrical loads at the load space, receipt of an indication that the one or more electrical loads are physically being delivered to the load space, etc. The space can include a computer space in a data center, and the electrical loads can include one or more rack computer systems.

At 604, based on the determination that one or more electrical loads are inbound, a determination is made regarding whether one or more corresponding load positions in the load space are available to accommodate the one or more electrical loads and are presently located proximate to an installed ATS cabinet, such that the positions are referred to as being "served" by the installed ATS cabinet. A position which is "served" by an ATS cabinet can refer to a load position where an electrical load installed in the position can be electrically coupled with a cabinet outlet receptacle of the ATS cabinet, such that the electrical load receives power support from one or more ATS modules included in the ATS cabinet. Whether a position is "served" and "available" can be based on a determination of whether a proximate ATS cabinet includes one or more cabinet outlet receptacles which are available to be electrically coupled to a load installed in the position. Such one or more cabinet outlet receptacles can include cabinet outlet receptacles to which one or more other electrical loads are not presently electrically coupled.

At 610, in response to a determination that no available served positions are in the space, an ATS cabinet is installed proximate to one or more available, unserved positions, and at least one ATS module is installed in at least one ATS module slot of the ATS cabinet, such that the ATS cabinet is configured to provide one or more of power support, power redundancy support, etc. to one or more electrical loads installed in at least one proximate available position. As a result, the at least one proximate available position can be referred to as an available served position. The quantity of ATS modules installed in the cabinet installed at 610 can match the quantity of electrical loads which are determined to be inbound for installation at 602.

At 606, in response to a determination that an available served position is present in the space at 604, a determination is made regarding whether an available ATS module which is not presently supporting an installed electrical load is present in the ATS cabinet, such that an inbound load can be electrically coupled to one or more power feeds via the available ATS module when the electrical load is coupled to an available outlet of the cabinet. If not, as shown at 608, an ATS module is installed in at least one slot in the cabinet, where the installation of the ATS module includes electrically coupling ATS inlet connectors in the ATS module with slot power feed connectors coupled to one or more power feeds in the slot, and electrically coupling an ATS outlet connector in the module with a slot outlet connector in the slot. Such electrical coupling can be established via blind-mate connections between blind mate connectors on the module and the slot, where the blind-mate connections are established based at least in part upon slidably engaging the module into the slot.

As a result of installing the ATS module in a cabinet slot at 608, at least one available outlet of the cabinet is electrically coupled to the ATS included in the ATS module and is further electrically coupled to at least one power feed via the ATS module.

At 612, the inbound load is installed in the available served position. Such installation can include physically mounting the load in the position. At 614, the installed load is coupled to the available outlet receptacle which is electrically coupled to an available ATS module. The coupling can include extending a power conduit of the electrical load, including a power cable which terminates in a power cable connector, from the electrical load and coupling the power cable connector to the available cabinet outlet, so that the load is electrically coupled to an available ATS via the power cable and the available cabinet outlet receptacle. Such coupling can be independent of any branch circuits between the cabinet and the electrical load.

At 616, a determination is made regarding whether to replace one or more ATS modules installed in the ATS cabinet. Such ATS modules can include one or more ATS modules presently providing one or more of power support, power redundancy support, etc. to one or more electrical loads. Such a determination can be based on a determination that a failure has occurred in associated with one or more portions of the ATS module.

If so, at 618, the one or more ATS modules are replaced in one or more slots of the cabinet, which can include hot-swapping the one or more modules in the one or more slots. Such replacement can include selectively bypassing the one or more ATS modules, via operation of one or more bypass devices included in the cabinet, concurrently with the replacement, such that continuous power support to the one or more electrical loads supported by the one or more ATS modules is maintained and the one or more ATS modules are electrically isolated prior to removing the one or more ATS modules from the one or more slots. The bypassing can be discontinued subsequent to installing one or more replacement ATS modules in the one or more slots.

At 620, a determination is made regarding whether a failure has occurred with regard to one or more air moving device assemblies included in an elevated ATS cabinet. Such a determination can include a determination that the cooling support provided by the one or more air moving device assemblies is degraded below a particular proportion of maximum device cooling support capacity of the one or more assemblies. The determination can be made based on a visually observable indication provided by one or more indicators include in the cabinet and electrically coupled to the one or more air moving device assemblies, where the one or more indicators provide the one or more indications, at one or more portions of the cabinet, of a failure in one or more portions of the one or more air moving device assemblies.

If so, at 622, the one or more air moving device assemblies are swapped in the cabinet. Such swapping can include physically removing the air moving device assembly as an individual module and installing a replacement assembly in the space vacated by the removed assembly.

Figure 7:
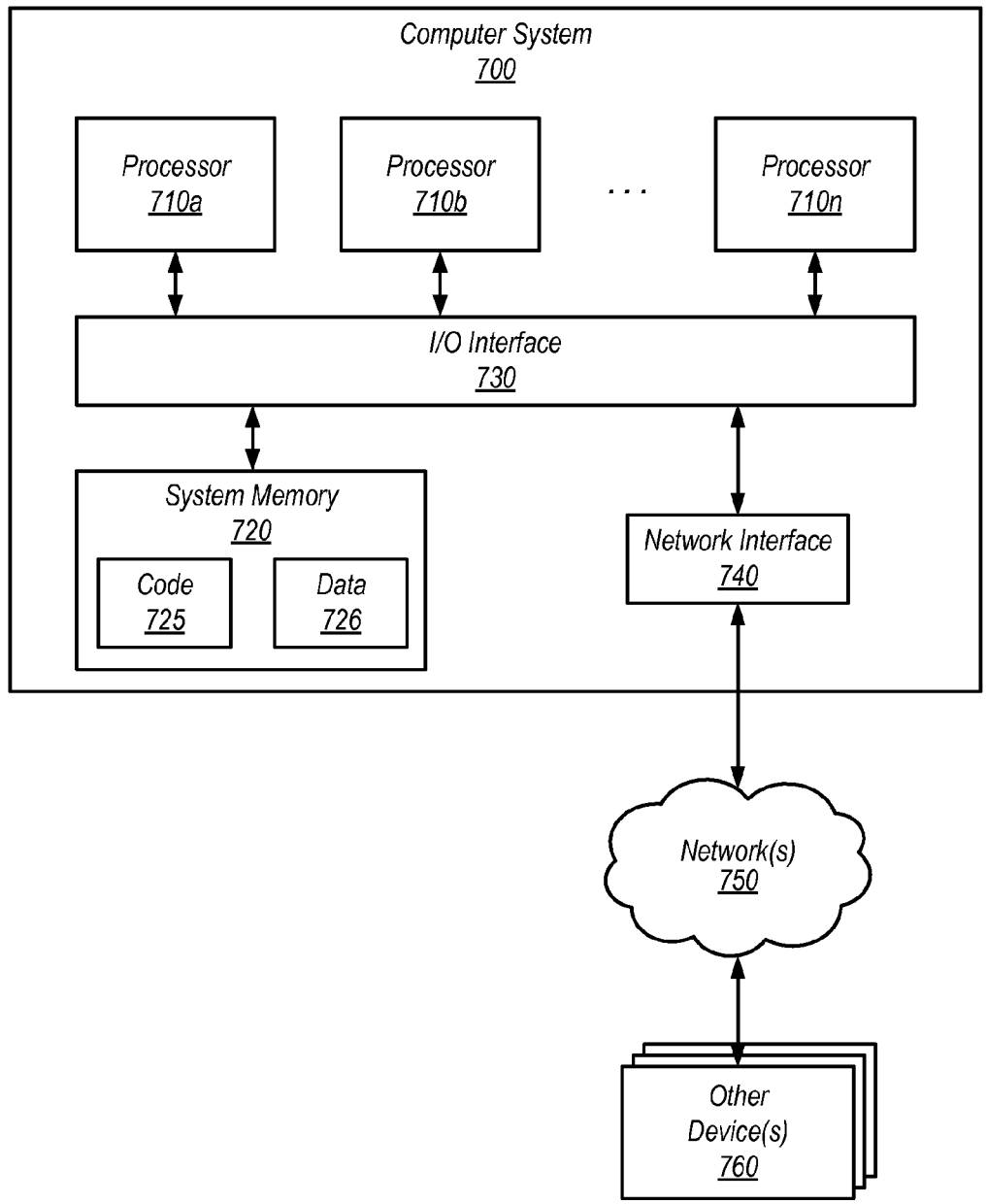
FIG. 7 is a block diagram illustrating an example computer system that may be used in some embodiments.

FIG. 7 is a block diagram illustrating an example computer system that may be used in some embodiments.

In some embodiments, a system that implements a portion or all of one or more of the technologies, methods, systems, devices, and apparatuses as described herein may include a general-purpose computer system that includes or is configured to access one or more computer-accessible media, such as computer system 700 illustrated in FIG. 7. In the illustrated embodiment, computer system 700 includes one or more processors 710 coupled to a system memory 720 via an input/output (I/O) interface 730. In some embodiments, computer system 700 further includes a network interface 740 coupled to I/O interface 730. In some embodiments, computer system 700 is independent of a network interface and can include a physical communication interface that can couple with a communication pathway, including a communication cable, power transmission line, etc. to couple with various external components, systems, etc.

In various embodiments, computer system 700 may be a uniprocessor system including one processor 710, or a multiprocessor system including several processors 710 (e.g., two, four, eight, or another suitable number). Processors 710 may be any suitable processors capable of executing instructions. For example, in various embodiments, processors 710 may be general-purpose or embedded processors implementing any of a variety of instruction set architectures (ISAs), such as the x86, PowerPC, SPARC, or MIPS ISAs, or any other suitable ISA. In multiprocessor systems, each of processors 710 may commonly, but not necessarily, implement the same ISA.

System memory 720 may be configured to store instructions and data accessible by processor(s) 710. In various embodiments, system memory 720 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as a portion or all of one or more of the technologies, methods, systems, devices, and apparatuses as described herein, are shown stored within system memory 720 as code 725 and data 726.

In one embodiment, I/O interface 730 may be configured to coordinate I/O traffic between processor 710, system memory 720, and any peripheral devices in the device, including network interface 740 or other peripheral interfaces. In some embodiments, I/O interface 730 may perform any necessary protocol, timing or other data transformations to convert data signals from one component (e.g., system memory 720) into a format suitable for use by another component (e.g., processor 710). In some embodiments, I/O interface 730 may include support for devices attached through various types of peripheral buses, such as a variant of the Peripheral Component Interconnect (PCI) bus standard or the Universal Serial Bus (USB) standard, for example. In some embodiments, the function of I/O interface 730 may be split into two or more separate components, such as a north bridge and a south bridge, for example. Also, in some embodiments some or all of the functionality of I/O interface 730, such as an interface to system memory 720, may be incorporated directly into processor 710.

Network interface 740 may be configured to allow data to be exchanged between computer system 700 and other devices 760 attached to a network or networks 750, such as other computer systems, components, processor units, or devices as illustrated in FIGS. 1 through 6, for example. In various embodiments, network interface 740 may support communication via any suitable wired or wireless general data networks, such as types of Ethernet network, for example. Additionally, network interface 740 may support communication via telecommunications/telephony networks such as analog voice networks or digital fiber communications networks, via storage area networks such as Fibre Channel SANs, or via any other suitable type of network and/or protocol.

In some embodiments, system memory 720 may be one embodiment of a computer-accessible medium configured to store program instructions and data for implementing embodiments of a portion or all of one or more of the technologies, methods, systems, devices, and apparatuses as described herein relative to FIGS. 1-6. In other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 700 via I/O interface 730. A non-transitory computer-accessible storage medium may also include any volatile or non-volatile media such as RAM (e.g. SDRAM, DDR SDRAM, RDRAM, SRAM, etc.), ROM, etc., that may be included in some embodiments of computer system 700 as system memory 720 or another type of memory. Further, a computer-accessible medium may include transmission media or signals such as electrical, electromagnetic, or digital signals, conveyed via a communication medium such as a network and/or a wireless link, such as may be implemented via network interface 740.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center comprising:
   at least two power distribution systems configured to supply separate power feeds; and
   a computer space configured to support computing operations by two parallel rows of rack computer systems, wherein the computer space comprises:
   an aisle space comprising a long axis and at least two separate rows of rack computer systems, wherein each row of rack computer systems is positioned on an opposite side of the long axis, and each rack computer system is configured to receive intake air on a front side facing the long axis and to discharge exhaust air on a rear side that faces away from the long axis;
   at least two free-standing exhaust plenum structures, each mounted adjacent to rear sides of separate ones of the at least two rows of rack computer systems on opposite sides of the cold aisle space, wherein each free-standing exhaust plenum structure comprises a set of frame members which are configured to provide structural support to an enclosure of an internal exhaust air plenum which is configured to receive the exhaust air from the rear side of an adjacent row of rack computer systems; and at least two elevated automatic transfer switch (ATS) cabinets which are each mounted in elevated positions above a separate row of rack computer systems and are each configured to selectively supply power, to the separate rows of rack computer systems, from a selected power feed of the separate power feeds, wherein each elevated ATS cabinet comprises:

a mounting arm element configured to couple the elevated ATS cabinet with a frame member of a separate free-standing exhaust plenum structure;

at least two power bus systems configured to carry electrical power from separate power feeds;

a set of cabinet outlet receptacles which are each configured to physically couple with a separate power cable extending from a separate rack computer system, independently of any branch circuits; and a set of ATS modules installed in separate ATS module slots, wherein each ATS module comprises an ATS configured to distribute electrical power from a selected power feed, of the separate power feeds, to a separate cabinet outlet receptacle, and wherein the ATS modules and the ATS module slots comprise blind mate connections configured to electrically couple ATS modules installed in ATS module slots with the power bus systems and separate cabinet outlet receptacles via blind mate connections.

2. The data center of claim 1, wherein:

the at least two elevated ATS cabinets comprise at least two sets of elevated ATS cabinets which are each coupled with separate free-standing exhaust plenum structures above separate rows of rack computer systems;

each separate set of elevated ATS cabinets comprises a separate plurality of elevated ATS cabinets which are each mounted proximate to a separate limited selection of rack computer systems, of the separate row of rack computer systems; and each elevated ATS cabinet in each set of elevated ATS cabinets is electrically coupled to power cables of a separate limited selection of rack computer systems.

3. The data center of claim 1, wherein:

each free-standing exhaust plenum structure comprises an enclosure gap which is located proximate to an elevated ATS cabinet coupled to the respective free-standing exhaust plenum structure; and each elevated ATS cabinet comprises:

a set of removable air moving devices configured to induce an airflow of exhaust air, out of a rear end of the respective elevated ATS cabinet which is proximate to the respective free-standing exhaust plenum structure to which the respective elevated ATS cabinet is coupled, that removes heat generated by one or more heat generating components included in the respective elevated ATS cabinet; and a baffle element configured to establish a conduit, between the rear end of the elevated ATS cabinet and an enclosure gap in the respective free-standing exhaust plenum structure, which partitions the airflow of exhaust air from entering the aisle space and directs the airflow of exhaust air to flow to the exhaust air plenum of the respective free-standing exhaust plenum structure via the enclosure gap.

4. The data center of claim 1, wherein each elevated ATS cabinet comprises:

a bypass device configured to bypass one or more ATS modules, of the set of ATS modules, wherein to bypass the one or more ATS modules, the bypass device is configured to:

route electrical power carried on at least one power bus system, independently of the one or more ATS modules, to one or more cabinet outlet receptacles coupled to the one or more ATS modules, such that the electrical power bypasses the one or more ATS modules; and electrically isolate the one or more ATS modules from the power bus systems and the one or more cabinet outlet receptacles; and a selector device which comprises a user interface and is configured to selectively command the bypass device to bypass the one or more ATS modules based on user interaction with the user interface.

5. An apparatus comprising:

an elevated automatic transfer switch (ATS) cabinet configured to provide power support to a set of electrical loads via a set of ATS modules which are each configured to selectively distribute power to separate electrical loads from one of a set of power feeds, wherein the elevated ATS cabinet comprises:

a mounting arm element configured to physically couple with a structural frame member, such that the elevated ATS cabinet is structurally supported by a structure in a suspended elevated position over a floor element; and a set of ATS module slots, each comprising a set of blind-mate slot power feed connectors which are electrically coupled to separate power feeds, wherein each ATS module slot is configured to electrically couple a separate ATS module installed in the respective ATS module slot with the separate power feeds based on blind-mate connections between the set of blind-mate slot power feed connectors and blind-mate ATS inlet connectors of the separate ATS module.

6. The apparatus of claim 5, wherein the elevated ATS cabinet comprises:

a set of cabinet outlet receptacles which are each configured to electrically couple an ATS outlet of a separate ATS module, installed in a separate ATS module slot, with a separate electrical load independently of any branch circuits extending between the elevated ATS cabinet and the separate electrical load.

7. The apparatus of claim 6, wherein, to electrically couple ATS outlets of separate ATS modules with separate electrical loads independently of any branch circuits, the set of cabinet outlet receptacles are each configured to physically couple with a separate power cable connector of a separate power cable extending from a separate electrical load.

8. The apparatus of claim 5, wherein:

the set of ATS module slots comprises a plurality of sets of ATS module slots; and each separate set of ATS module slots is configured to electrically couple ATS modules installed in the set of ATS module slots to a separate phase of at least one power feed, of the separate power feeds.

9. The apparatus of claim 5, wherein:

the elevated ATS cabinet comprises an air moving device assembly which is configured to induce an airflow, through the elevated ATS cabinet, which removes heat generated by one or more heat generating components included in the elevated ATS cabinet and is further configured to be reversibly removed from the elevated ATS cabinet.

10. The apparatus of claim 9, wherein the elevated ATS cabinet comprises:
an indicator configured to provide a visually observable indication of a failure of the air moving device.

11. The apparatus of claim 9, wherein the elevated ATS cabinet comprises:
a baffle element configured to:
establish a conduit extending from one end of the elevated ATS cabinet; and
direct airflow exiting the elevated ATS cabinet at the one end of the elevated ATS cabinet through the conduit.

12. The apparatus of claim 5, wherein the elevated ATS cabinet comprises:
a bypass device configured to bypass a selected one or more ATS modules, of the set of ATS modules, wherein to bypass the selected one or more ATS modules, the bypass device is configured to:
route power from one of the separate electrical power feeds to the electrical loads coupled to the selected one or more ATS modules, such that the routed power bypasses the selected one or more ATS modules; and
electrically isolate the selected one or more ATS modules from the separate power feeds and the one or more electrical loads.

13. The apparatus of claim 12, wherein the elevated ATS cabinet comprises:
a selector device which comprises a user interface and is configured to selectively command the bypass device to bypass the selected one or more ATS modules based on user interaction with the user interface.

14. A method comprising:
configuring an elevated automatic transfer switch (ATS) cabinet to provide power support to a set of electrical loads via a set of ATS modules which are each configured to selectively distribute power from one of a set of power feeds to separate electrical loads, wherein the configuring comprises:
coupling a mounting arm element of the elevated ATS cabinet with a free-standing structure frame member, such that the elevated ATS cabinet is structurally supported by the free-standing structure in a suspended elevated position over a floor element; and
installing the set of ATS modules in a set of ATS module slots of the elevated ATS cabinet, wherein each ATS module slot comprises a set of blind-mate slot connectors which are electrically coupled to separate power feeds, such that installing a given ATS module in a given slot comprises establishing blind-mate connections, between the set of blind-mate slot connectors in the given slot and blind-mate ATS inlet connectors of the given ATS module, which electrically couples the given ATS module with the separate power feeds.

15. The method of claim 14, wherein:
the elevated ATS cabinet comprises a set of cabinet outlet receptacles which are each configured to electrically couple a separate ATS module, installed in a separate ATS module slot, with a separate electrical load; and
the configuring comprises physically coupling separate power cable connectors, of separate power cables extending from the separate electrical loads, with separate cabinet outlet receptacles, of the set of cabinet outlet receptacles, independently of any branch circuits extending between the elevated ATS cabinet and the separate electrical loads, such that each the set of cabinet outlet receptacles electrically couple the separate electrical loads with separate ATS modules installed in the elevated ATS cabinet.

16. The method of claim 14, wherein:
installing the set of ATS modules in a set of ATS module slots of the elevated ATS cabinet comprises incrementally installing a quantity of ATS modules in the set of ATS module slots in response to incremental installation of a common quantity of electrical loads at load positions which are proximate to the elevated ATS cabinet.

17. The method of claim 14, wherein the configuring comprises:
installing an air moving device assembly into the elevated ATS cabinet, such that the air moving device assembly is electrically coupled to at least one of the power feeds; and
operating the air moving device assembly to induce an airflow, through the elevated ATS cabinet, which removes heat generated by one or more heat generating components included in the elevated ATS cabinet.

18. The method of claim 17, wherein:
the elevated ATS cabinet comprises an indicator configured to provide a visually observable indication of a failure of the air moving device; and
the configuring comprises swapping the air moving device assembly with a replacement air moving device assembly, based on the indicator providing the visually observable indication.

19. The method of claim 17, wherein the configuring comprises:
coupling a baffle element to a rear end, of the elevated ATS cabinet, via which the induced airflow is discharged from the elevated ATS cabinet as exhaust air; and
extending the baffle element from the rear end of the elevated ATS cabinet to an exhaust air plenum which is partitioned from a space in which the elevated ATS cabinet is located, such that the baffle element establishes a conduit via which the exhaust air is removed from the space while being partitioned from air circulating through the space external to the conduit.

20. The method of claim 14, comprising:
bypassing a selected one or more ATS modules, of the set of ATS modules, based on user interaction with a user interface of the elevated ATS cabinet, wherein the bypassing comprises:
routing power from one of the separate power feeds to one or more electrical loads electrically coupled to the selected one or more ATS modules, such that the routed power bypasses the selected one or more ATS modules; and
electrically isolating the selected one or more ATS modules from the separate power feeds and the one or more electrical loads.

* * * * *